(12) United States Patent
Koyama

(10) Patent No.: US 7,595,849 B2
(45) Date of Patent: Sep. 29, 2009

(54) DISPLAY DEVICE AND MANUFACTURING METHOD THEREOF

(75) Inventor: Masaki Koyama, Atsugi (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 12/010,927

(22) Filed: Jan. 31, 2008

(65) Prior Publication Data

US 2008/0149931 A1 Jun. 26, 2008

Related U.S. Application Data

(62) Division of application No. 10/744,137, filed on Dec. 24, 2003, now Pat. No. 7,390,728.

(30) Foreign Application Priority Data

Dec. 27, 2002 (JP) ............................. 2002-380882

(51) Int. Cl.
- G02F 1/1368 (2006.01)
- H01L 29/04 (2006.01)
- H01L 51/50 (2006.01)

(52) U.S. Cl. .................. 349/42; 257/72; 313/504; 315/169.3

(58) Field of Classification Search ............... 349/33, 349/42, 43, 187; 257/59, 72, 347, 350, 79, 257/83, 87, 98, E21.703, E27.06, E27.111; 438/30; 345/92, 76; 313/500, 504; 315/169.3
See application file for complete search history.

(56) References Cited

U.S. PATENT DOCUMENTS

| | | | |
|---|---|---|---|
| 4,330,363 A | 5/1982 | Biegesen et al. | |
| 4,370,175 A | 1/1983 | Levatter | |
| 4,566,043 A | 1/1986 | Tamura | |
| 4,668,089 A | 5/1987 | Oshida et al. | |
| 4,978,970 A | 12/1990 | Okazaki | |
| 5,558,788 A | 9/1996 | Mashburn | |
| 5,576,857 A * | 11/1996 | Takemura | ............ 349/42 |
| 5,643,826 A | 7/1997 | Ohtani et al. | |
| 5,803,965 A | 9/1998 | Yoon | |
| 5,854,803 A | 12/1998 | Yamazaki et al. | |
| 5,869,803 A | 2/1999 | Noguchi et al. | |
| 5,886,320 A | 3/1999 | Gallo et al. | |

(Continued)

FOREIGN PATENT DOCUMENTS

JP          09-045632 A          2/1997

(Continued)

*Primary Examiner*—Dung Nguyen
*Assistant Examiner*—Tai Duong
(74) *Attorney, Agent, or Firm*—Nixon Peabody LLP; Jeffrey L. Costellia

(57) ABSTRACT

The present invention is to reduce display unevenness in a display device caused by dispersion of energy density of a laser beam. It is difficult for a periodical pattern to be recognized as display unevenness in display image. The display device of the present invention can visually reduce the display unevenness in the display image by utilizing the visual advantage described above. The display device can be manufactured using a TFT array substrate in which electric characteristic of plural TFTs arranged in a line in the minor axis direction of an linear shaped laser beam periodically fluctuates depending on the place in which each TFT is formed.

18 Claims, 13 Drawing Sheets
(2 of 13 Drawing Sheet(s) Filed in Color)

U.S. PATENT DOCUMENTS

| | | | |
|---|---|---|---|
| 5,923,962 A | 7/1999 | Ohtani et al. | |
| 5,953,597 A | 9/1999 | Kusumoto et al. | |
| 5,981,974 A * | 11/1999 | Makita | 257/72 |
| 6,043,453 A | 3/2000 | Arai | |
| 6,180,957 B1 * | 1/2001 | Miyasaka et al. | 257/57 |
| 6,204,099 B1 | 3/2001 | Kusumoto et al. | |
| 6,210,996 B1 | 4/2001 | Yamazaki et al. | |
| 6,259,138 B1 * | 7/2001 | Ohtani et al. | 257/351 |
| 6,265,745 B1 | 7/2001 | Kusumoto et al. | |
| 6,285,042 B1 | 9/2001 | Ohtani et al. | |
| 6,323,515 B1 * | 11/2001 | Yamazaki et al. | 257/316 |
| 6,335,541 B1 | 1/2002 | Ohtani et al. | |
| 6,337,677 B1 * | 1/2002 | Higashi | 345/100 |
| 6,365,933 B1 | 4/2002 | Yamazaki et al. | |
| 6,372,039 B1 | 4/2002 | Okumura et al. | |
| 6,396,616 B1 | 5/2002 | Fitzer et al. | |
| 6,468,842 B2 | 10/2002 | Yamazaki et al. | |
| 6,555,422 B1 | 4/2003 | Yamazaki et al. | |
| 6,567,219 B1 | 5/2003 | Tanaka | |
| 6,573,162 B2 | 6/2003 | Tanaka et al. | |
| 6,590,230 B1 | 7/2003 | Yamazaki et al. | |
| 6,599,788 B1 | 7/2003 | Kawasaki et al. | |
| 6,638,800 B1 | 10/2003 | Ishihara et al. | |
| 6,650,480 B2 | 11/2003 | Tanaka | |
| 6,700,096 B2 | 3/2004 | Yamazaki et al. | |
| 6,727,124 B2 | 4/2004 | Nakajima et al. | |
| 6,806,862 B1 | 10/2004 | Zhang et al. | |
| 6,897,889 B2 | 5/2005 | Tanaka | |
| 7,259,738 B2 | 8/2007 | Zhang et al. | |
| 7,359,412 B2 * | 4/2008 | Miyairi et al. | 372/29.01 |
| 7,476,937 B2 | 1/2009 | Kawasaki et al. | |
| 2001/0019861 A1 | 9/2001 | Yamazaki et al. | |
| 2001/0021544 A1 | 9/2001 | Ohnuma et al. | |
| 2002/0094008 A1 | 7/2002 | Tanaka | |
| 2002/0100937 A1 | 8/2002 | Yamazaki et al. | |
| 2003/0089691 A1 | 5/2003 | Tanaka | |
| 2003/0112322 A1 | 6/2003 | Tanaka | |
| 2003/0153167 A1 | 8/2003 | Ohnuma et al. | |

FOREIGN PATENT DOCUMENTS

| | | |
|---|---|---|
| JP | 09-061843 A | 3/1997 |
| JP | 2000-131670 A | 5/2000 |
| JP | 3135643 | 2/2001 |
| JP | 2001-127305 A | 5/2001 |
| JP | 2002-222960 A | 8/2002 |
| JP | 2002-359191 A | 12/2002 |
| JP | 2002-366057 A | 12/2002 |

* cited by examiner

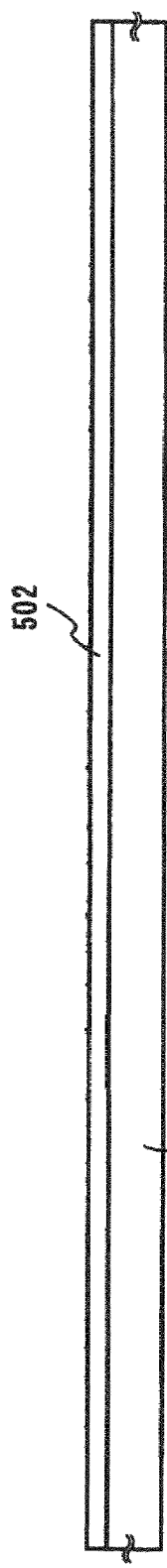
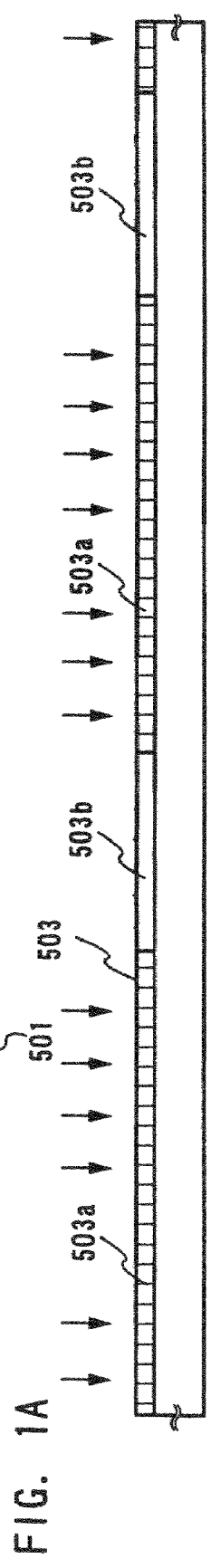
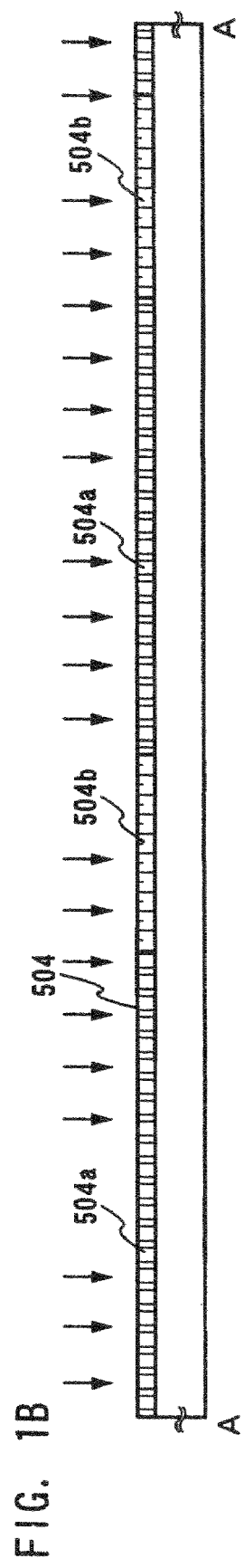
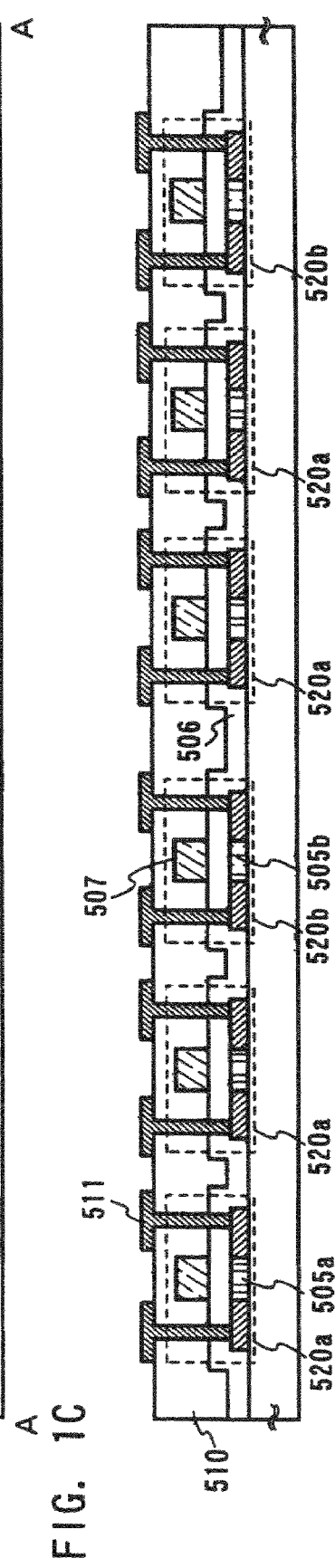

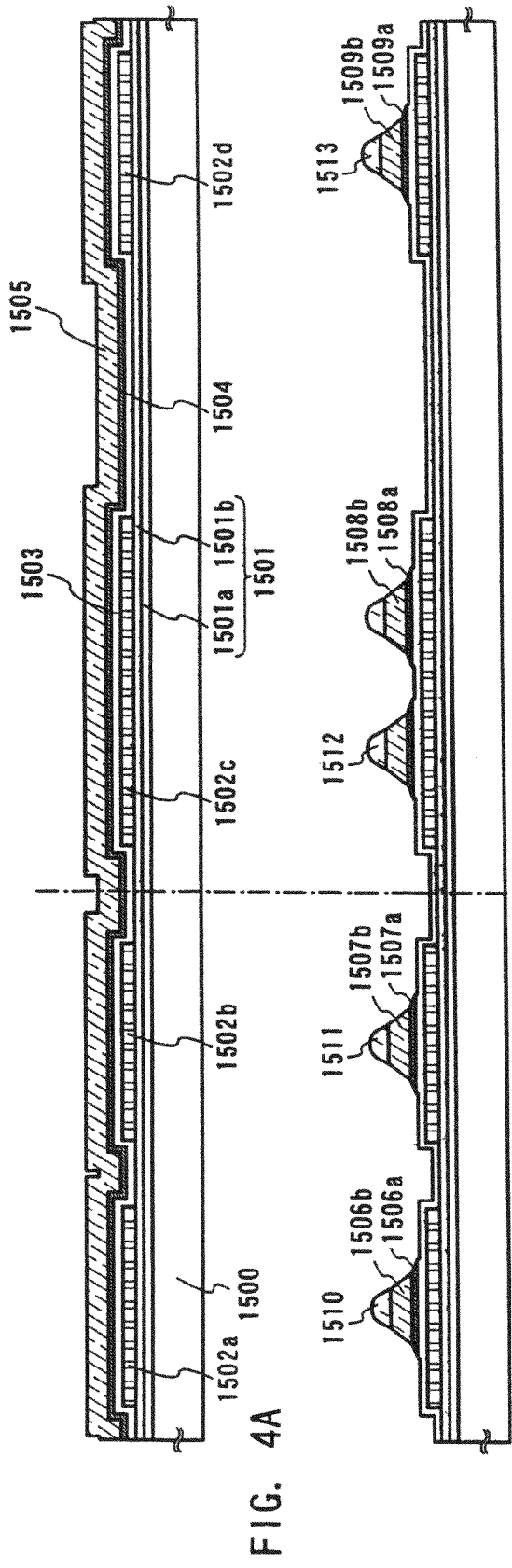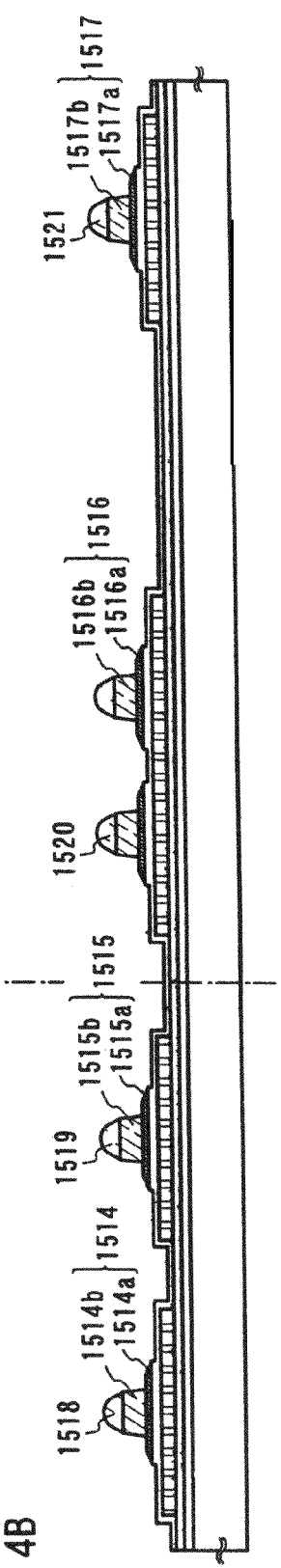

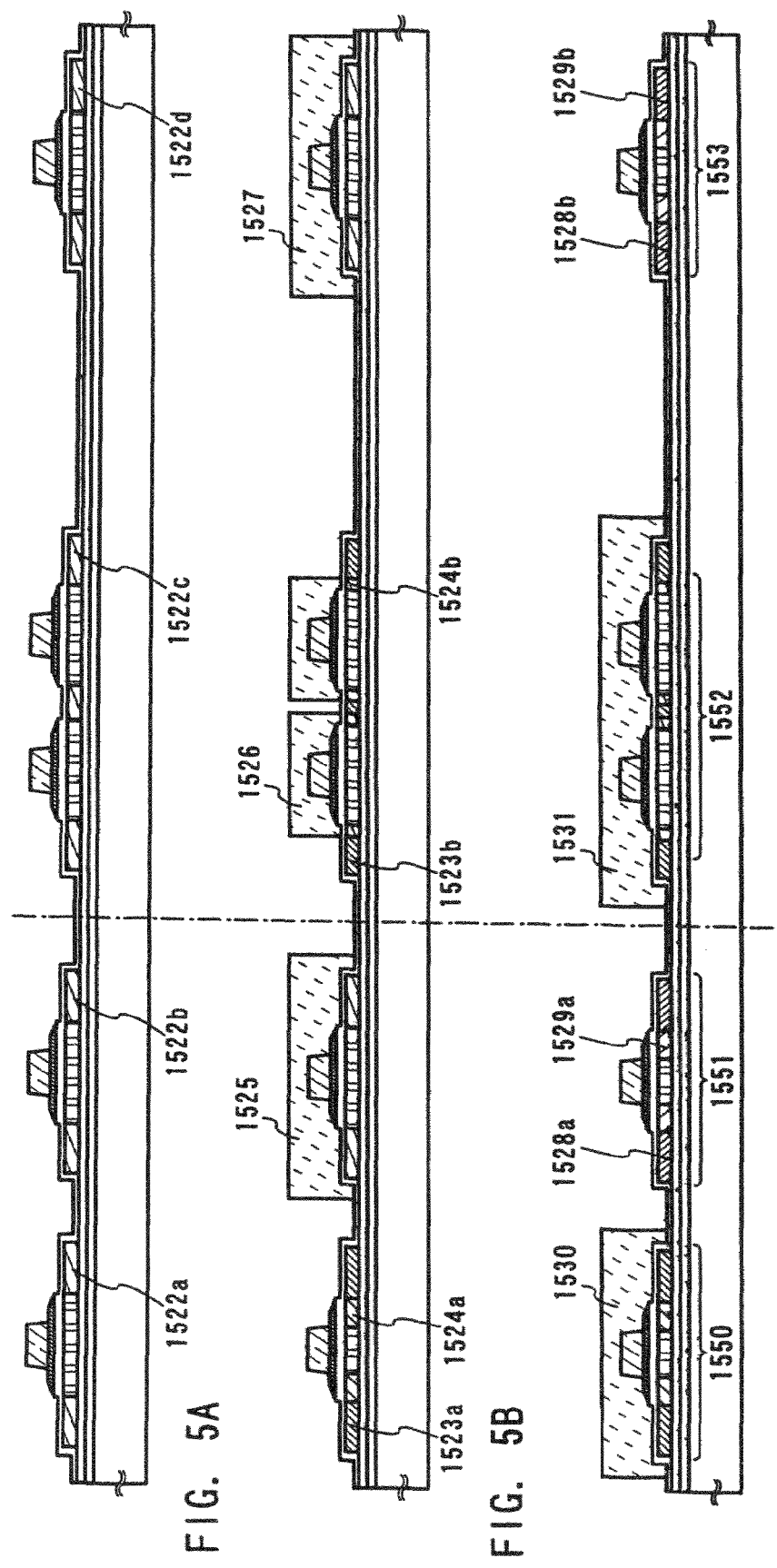

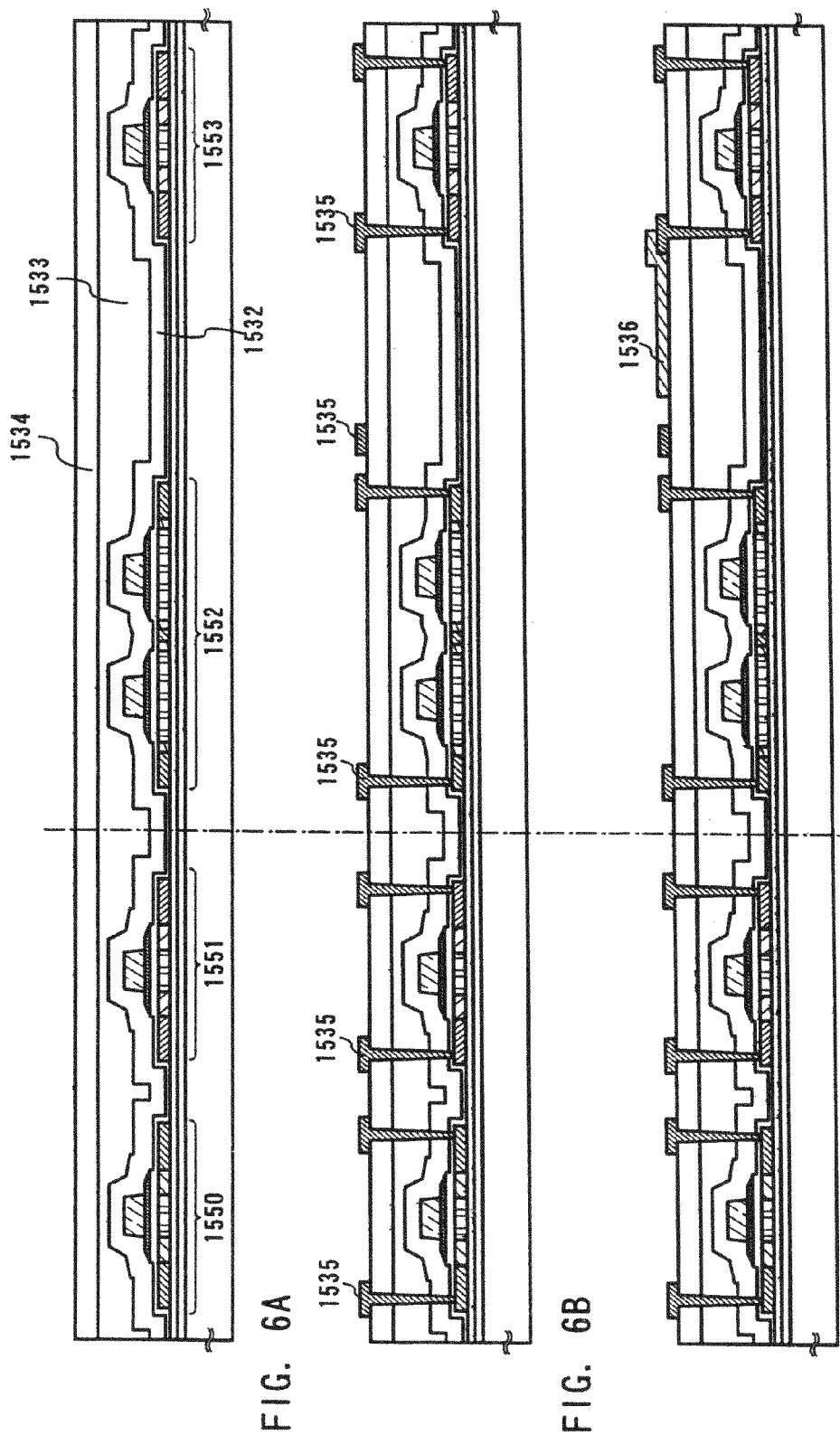

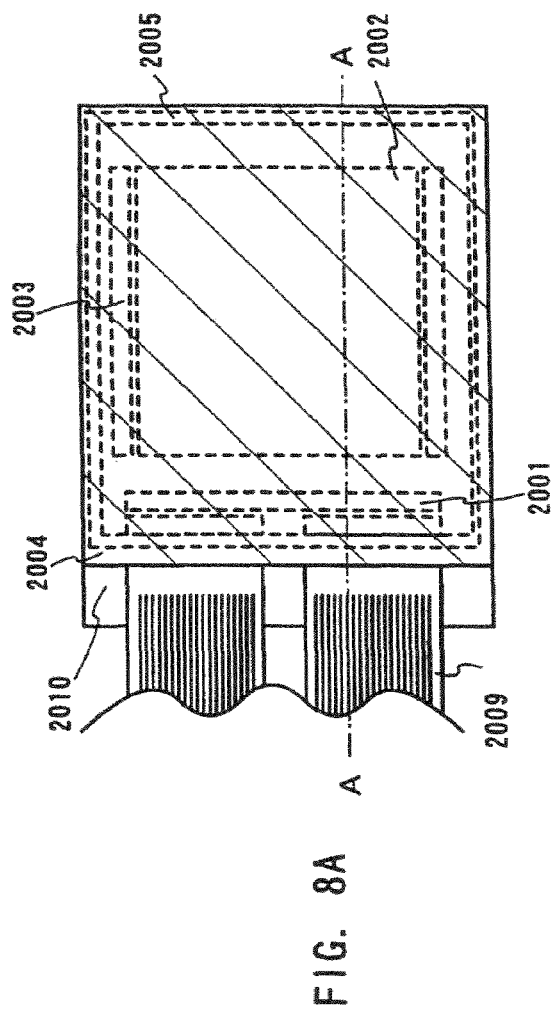
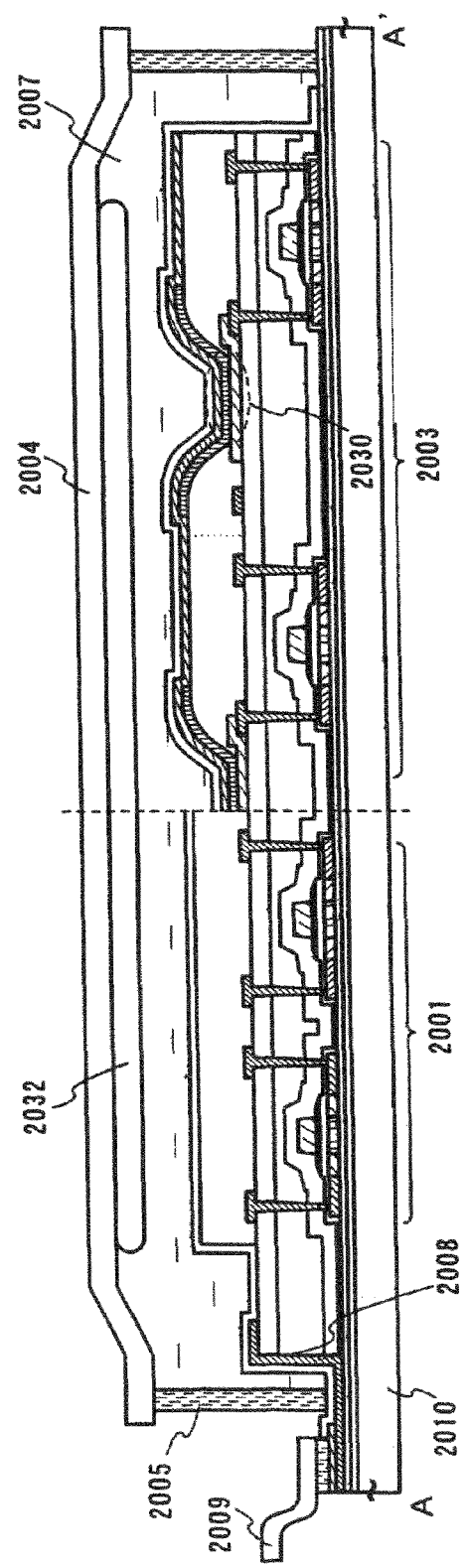
FIG. 8A
FIG. 8B

DISPLAY DEVICE AND MANUFACTURING METHOD THEREOF

This application is a Divisional of application Ser. No. 10/744,137 filed Dec. 24, 2003, now U.S. Pat. No. 7,390,728 B2.

BACKGROUND OF THE INVENTION

1. Field of the Invention

The present invention relates to a means for reducing display unevenness, and more specifically, the present invention relates to a display device given a reduction measure of display unevenness caused by dispersion of energy density of a laser beam, and a manufacturing method thereof.

2. Description of the Related Art

A thin film transistor (hereinafter referred to as a TFT) is used as an element for driving a liquid crystal display device, EL (Electro Luminescence) display device and the like. A glass substrate has been utilized for the purpose of manufacturing TFTs at low cost. It is difficult to manufacture a TFT in a way that requires a long time heat treatment at approximately equal to or more than 600° C. Thus, a technique for manufacturing a TFT in a low temperature process of at most 600° C. for highest temperature in the process has been developed. A crystallization method using a laser beam is generally utilized for a method for manufacturing a crystalline semiconductor film by such a low temperature process.

When dispersion of energy density of a laser beam due to instability of output in a laser oscillator is caused in a method for manufacturing a crystalline semiconductor film using a laser beam, hereby, film quality of the crystalline semiconductor film is also varied. It is know that dispersion of a TFT electrical characteristic is generated by the crystalline dispersion of the crystalline semiconductor film. Specifically, when an electrical characteristic of a TFT for driving a pixel is varied, brightness unevenness or display unevenness such as gradation unevenness is caused in a display image.

Accordingly, two laser oscillators are used alternatively, for example, maintenance is performed to the one oscillator while performing crystallization using one oscillator so as to obtain stable output from the laser oscillators all the time, then, an attempt to reduce film quality dispersion of crystalline semiconductor film due to dispersion of energy density of a laser beam has been performed. (For example, U.S. Pat. No. 3,135,643)

In the case of using the above-described method, there is an effect that the process is not required to be interrupted for the maintenance. However, the frequency of maintenance itself can not be reduced. Thus, the development for a method in which trouble involved in maintenance or the like is reduced, energy dispersion of a laser beam is reduced with more convenient method, and more satisfactory display image is obtained is required.

SUMMARY OF THE INVENTION

In view of the above-described problems, it is an object of the present invention to provide a display device in which display unevenness in display image can be visually reduced by utilizing a visual advantage that a periodical pattern is difficult to be visually recognized as display unevenness, and a manufacturing method thereof.

A display device of the present invention comprising a TFT array substrate over which plural TFTs are arranged has a characteristic that electrical characteristic corresponding to the same electrical signal of plural TFTs arranged in a line in at least one direction of columns or rows periodically fluctuates depending on the place in which each TFT is formed.

Note that the electrical characteristic is the one such as on current value or threshold value which are obtained when the same electric signal is applied to each TFT. Here, the on current value refers to current value in a saturation region, especially in VD-ID characteristic.

The display device is the one in which a light emitting element is provided; the luminescence brightness of a light emitting element periodically varies depending on the on current value of each TFT for driving a light emitting element.

The brightness variation of periodical luminescence appears as a periodical stripe pattern or a periodical lattice pattern in display image.

The periodical stripe pattern occurs in the case that the electrical characteristic under the same electrical signal of plural TFTs which are arranged in a line in at least one direction of columns or rows periodically fluctuates depending on the place in which each TFT is formed. In addition, the periodical lattice pattern occurs in the case that the electrical characteristic in response to the same signal of plural TFTs arranged in a line to the both directions of columns or rows periodically fluctuates depending on the place in which each TFT is formed.

Generally, the periodical pattern is difficult to be recognized as disorder of a display image. Meanwhile, a random striped pattern is easily identified as disorder of a display image.

The display device with which a semiconductor device of the present invention is provided can intentionally generate a periodical pattern. It becomes possible for brightness unevenness and the like caused in random stripped pattern to be hardly recognized as display unevenness.

In specific, the present invention has an effect of visually reducing brightness unevenness in a display image caused by energy dispersion of a laser beam.

A semiconductor device of the present invention comprising a TFT array substrate over which plural TFTs are arranged has a characteristic that film quality of a semiconductor film constituting plural TFTs arranged in a line in at least one direction of columns or rows periodically fluctuates depending on the place in which each TFT is formed.

In case that film quality of semiconductor films varies, an electrical characteristic of TFTs also varies when the same electric signal is applied thereto. Therefore, the electrical characteristic of plural TFTs arranged in one direction fluctuates periodically when the film quality of a semiconductor film constituting plural TFTs arranged in one direction fluctuates periodically.

A method for manufacturing a semiconductor device of the present invention is to manufacture a TFT by using a crystalline semiconductor film in which regions each having various film quality are formed periodically and repeatedly.

A crystalline semiconductor film in which regions having various film quality are repeatedly and periodically formed can be formed by forming a crystalline semiconductor film in which irradiation frequency of laser beams is periodically varied in each region.

A crystalline semiconductor film in which irradiation frequency of laser beams is periodically varied in each region thereof is formed by the following processes. A second semiconductor regions having plural crystalline regions are formed by irradiating a first semiconductor film with a first laser beam so that the plural crystalline regions are formed at periodical intervals. And, a third semiconductor film is formed by irradiating a whole area of the second semiconductor film with a second laser beam.

Namely, a first region irradiated with the first and second laser beams and a second region irradiated with only the second laser beam are repeatedly and periodically formed in the third semiconductor film. It is noted that the crystalline region formed by irradiating the first laser beam is irradiated "n" number times at a given point. Also, the whole semiconductor film is irradiated with the second laser beam "m" number of times at a given point. Therefore, the first region is irradiated "n+m" number of times with laser beams and the second region is irradiated "m" number of times with laser beams. The n and the m are optional natural numbers. In addition, the order of the processes for irradiating with the first laser beam and for irradiating with the second laser beam is in random order. Not only irradiation frequency but also energy density of a laser beam is changed in order to control the film quality of the crystalline semiconductor film.

The patent or application file contains at east one drawing executed in color. Copies of this patent or patent application publication with color drawing(s) will be provided by the Office upon request and payment of the necessary fee.

BRIEF DESCRIPTION OF THE DRAWINGS

The patent or application file contains at east one drawing executed in color. Copies of this patent or patent application publication with color drawing(s) will be provided by the Office upon request and payment of the necessary fee.

FIGS. 1A to 1D are diagrams showing a method for manufacturing a semiconductor device of the present invention;

FIGS. 4A to 4C are diagrams showing a method for manufacturing a semiconductor device of the present invention, and a method for manufacturing a display device using the semiconductor device;

FIGS. 5A to 5C are diagrams showing a method for manufacturing a semiconductor device of the present invention, and a method for manufacturing a display device using the semiconductor device;

FIGS. 6A to 6C are diagrams showing a method for manufacturing a semiconductor device of the present invention, and a method for manufacturing a display device using the semiconductor device;

FIGS. 8A and 8B are diagrams showing a method for manufacturing a semiconductor device of the present invention, and a method for manufacturing a display device using the semiconductor device;

DETAILED DESCRIPTION OF THE PREFERRED EMBODIMENT

Embodiment Mode

Embodiment Mode 1

Figure 2:
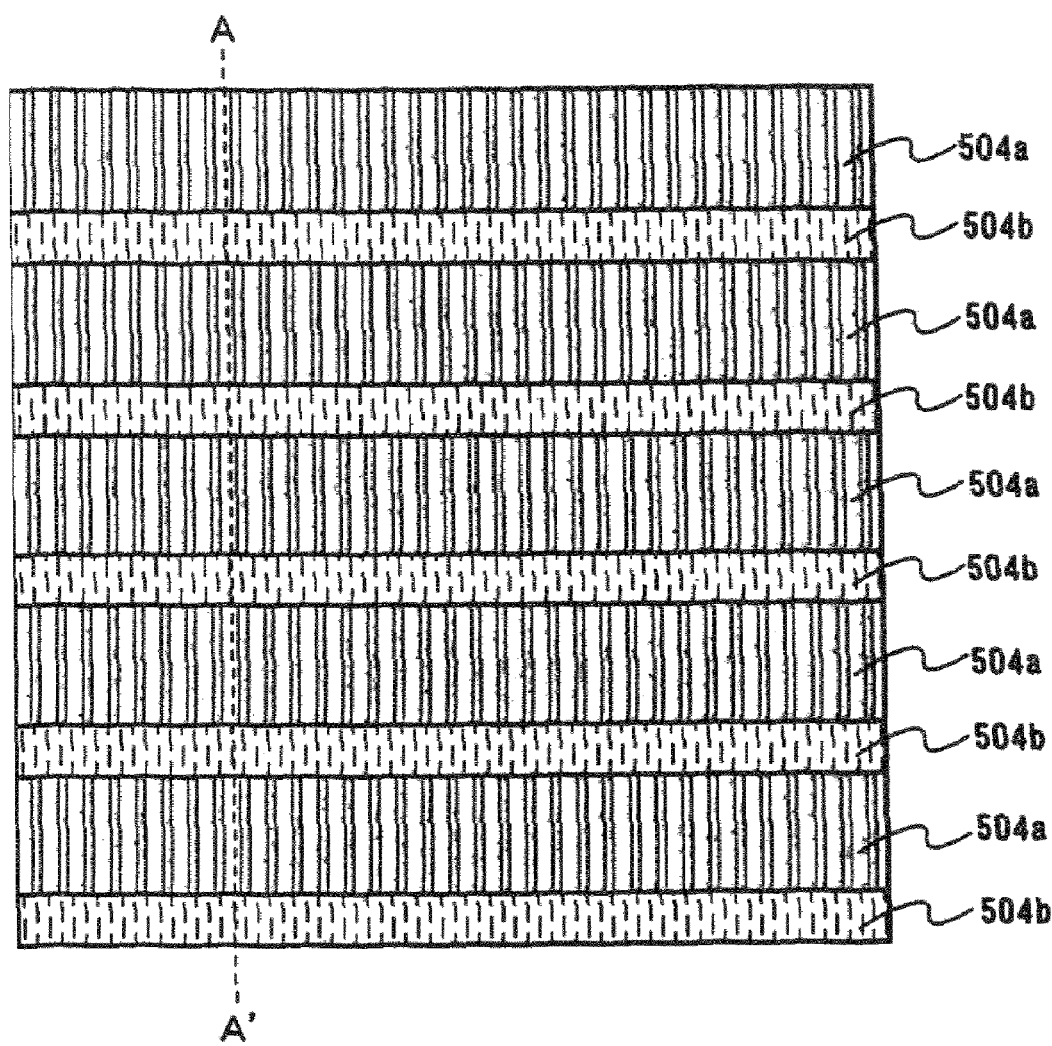
FIG. 2 is a diagram showing a method for manufacturing a semiconductor device of the present invention.

A method for manufacturing a display device of the present invention is described with reference to FIG. 1A to 1D and FIG. 2. A display device of the present invention can visually reduce display unevenness in display image by utilizing a visual advantage that a periodical pattern is difficult to be visually recognized as display unevenness. Especially, a display device of the present invention has a more advantage in the case of displaying a whole image with single brightness and a mono color (namely, under the same electric signal.)

In the present embodiment mode, a first and a second laser beams are pulsed laser beams formed in a linear shape. And the same laser medium and the same oscillatory frequency are used respectively. When either laser beam is used for irradiation, the position irradiated with a laser beam is changed by fixing the laser beam itself without scanning it and moving a stage on which a substrate 501 is mounted. The overlap ratio [%] between the region irradiated with a laser beam for "n" number of times and the region irradiated with a laser beam for "n+1" number of times can be indicated as xy/z×0.1 when the frequency of laser beams is set to x [Hz], the beam width of a laser beam in a minor axis direction is set to y [μm], and the movement speed of the stage is set to z [mm/sec].

A first semiconductor film 502 is formed over the substrate 501. A crystalline semiconductor film manufactured by performing heat treatment after doping a catalyst metal element into an amorphous semiconductor film is used as the first semiconductor film 502. Note that the first semiconductor film 502 is not limited to the above-mentioned film, and an amorphous silicon film may be used.

Next, a second semiconductor film 503 (503a and 503b) is formed by irradiating the first semiconductor film 502 with the first laser beam.

A frequency of a laser beam and a beam width of a laser beam in minor axis direction are fixed, the movement speed of the stage on which the second semiconductor film 503 is mounted is changed, and hence, the overlap ratio of the region irradiated with a laser beam may be adjusted to 70%. The second semiconductor film 503 is formed by irradiating the first semiconductor film 502 with the first laser beam in accordance with a manner described above. In this way, a region 503a irradiated with the first laser beam and a region 503b not irradiated with the first laser beam are alternately formed in cycles in the second semiconductor film 503. The regions 503a and 503b are formed at the area ratio of 7:3.

Then, a third semiconductor film 504 is formed by irradiating the second semiconductor film 503 (503a and 503b) with the second laser beam.

A frequency of a laser beam and a beam width in lengthwise direction are fixed, the movement speed of the stage on which the third semiconductor film 504 is mounted, and hence, the overlap ratio of the region irradiated with a laser beam may be adjusted to 1000 to 1500%. The third semiconductor film 504 is formed by irradiating the second semiconductor film 503 with the second laser beam in accordance with the above manner. According to this manner, the third semiconductor film 504 is irradiated at 10 to 115 number of times at a given point with the second laser beam. Therefore, a region 504a irradiated with the first and the second laser beams, and a region 504b irradiated with only the second laser beam are alternately formed in cycles in the third semiconductor film 504.

FIG. 2 shows a top view of a part of the third semiconductor film 504. It can be seen that the regions 504a and 504b are alternately formed in cycles in striped pattern.

As described above, an irradiation frequency of laser beams in the region 504a differs from that in the region 504b. As a result, film quality of the region 504a differs from that of the region 504b.

In the present embodiment mode, the overlap ratio is adjusted by changing the movement speed of the stage; however, the overlap ratio may be regulated by changing the frequency of the laser beam or the beam width of the laser beams. Further, the overlap ratio is not limited to the above-mentioned value, and it can be changed properly. Furthermore, the energy density of the first and the second laser beams may be different from each other, and can be regulated properly.

A catalyst metal element is removed from the third semiconductor film 504 which is formed as described above by a known gettering method.

TFTs 520a and 520b comprising a semiconductor films 505a and 505b, a gate insulating film 506, a gate electrode 507 are formed by a known TFT manufacturing method by using the third semiconductor film 504 (504a and 504b) in which the catalyst metal element is removed.

A TFT 520a formed by using a semiconductor film 505a separated from the third semiconductor film 504. In addition, a TFT 520b is formed by using a semiconductor film 505b separated from the third semiconductor film 504.

In the present embodiment mode, a TFT having a p-channel type single gate structure is formed by using a known method for manufacturing a TFT. In addition to the TFT having a single gate structure, a TFT having other structures such as a Lightly Doped Drain (LDD) structure may be formed. As for the channel type, it is not particularly limited, and n-channel type TFT may be manufactured, or both of n-channel type and p-channel type TFTs may be manufactured.

After manufacturing a TFTs 520a and 520b, a wiring 511 for transmitting an electric signal to an interlayer insulating film 510 and the TFT is formed, and a TFT array substrate is manufactured. Note that activation and hydrogen treating are performed after manufacturing the TFTs 520a and 520b.

Plural TFTs are formed over the substrate 501 by the above-described method. The electrical characteristic of the TFT 520a manufactured by using the semiconductor film 505a differs from that of the TFT 520b manufactured by using the semiconductor film 505a. Therefore, the position dependency of the on current value of TFTs arranged in the minor axis direction of the regions 504a and 504b has a periodical position dependency. The way of the repetition of ups and down in the on current value is similar to the repeat of the region 504a and the region 504b. Accordingly, the TFT array substrate in which the electrical characteristic of plural TFTs arranged in the same direction as the minor axis direction of a laser beam fluctuates periodically depending on the each TFT's position can be manufactured.

Then, a first electrode of a light emitting element (any one of an anode or a cathode), a partition layer (also referred to as a bump or a bank), a light emitting layer, and a second electrode of the light emitting element are formed over the TFT array substrate by using a know method and a known material. A display device provided with a light-emitting element formed of a first electrode of a light emitting element, a light emitting layer, and a second electrode of the light emitting element can be manufactured.

Embodiment

Embodiment 1

In the present embodiment, a method for manufacturing a display device of the present invention is described with reference to FIG. 3A to 8B. In this embodiment, a display device provided with a light-emitting element as a display device is manufactured.

According to a method for manufacturing a display device of the present invention, a TFT array substrate in which the electrical characteristic of plural TFTs arranged in the same direction as minor axis direction of a laser beam fluctuates periodically depending on the each TFT's location can be manufactured. A periodical striped pattern is generated in a display image of a display device provided with the TFT array substrate. Consequently, brightness unevenness due to a random striped pattern can be visually reduced specially in the case of displaying a whole image with single brightness and a mono color (namely, under the same electric signal) by utilizing a visual advantage that a periodical pattern is difficult to be visually recognized as image unevenness. A display device of the present invention can be manufactured easily and at low cost compared with one manufactured by the conventional technique since a particular technique and the like are not required to an optical system of a laser apparatus, and a maintenance of a laser oscillator is not required frequently.

A base insulating film 1501a with a film thickness of from 50 to 100 nm and a base insulating film 1501b with a film thickness of from 50 to 100 nm are deposited over a substrate 1500. The base insulating films 1501a and 1501b are formed for preventing impurity diffusion from the substrate 1500 to a semiconductor layer. In the present embodiment, a low alkali glass is used as the substrate, a silicon nitride film with a film thickness of 100 nm as the base insulating film 1501a and a silicon oxide film with a film thickness of 100 nm as the base insulating film 1501b are deposited by a plasma chemical vapor deposition (CVD) method. In the present embodiment, the insulating film is formed by two lamination layers; however, it can be one lamination layer or at least three lamination layers provided impurity diffusion can be prevented.

Next, a semiconductor film is formed over the base insulating film 1501b. The method of the semiconductor film is described as below.

An amorphous silicon film (not shown) with a film thickness of 55 nm is formed over the base insulating film 1501b by a known formation method (a CVD method, a sputtering method or the like). Subsequently, nickel (Ni) is doped therein as a catalyst metal element, and heat treatment is performed at 550° C. for 4 hours in order to form a crystalline silicon film 5002.

Figure 3A:
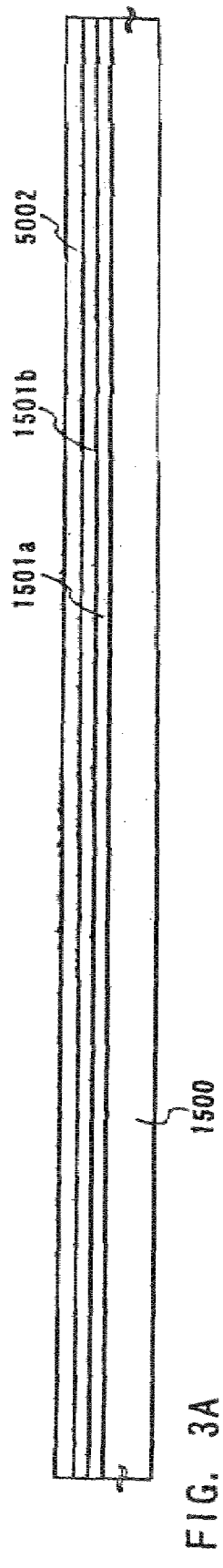
FIGS. 3A to 3C are diagrams showing a method for manufacturing a semiconductor device of the present invention, and a method for manufacturing a display device using the semiconductor device.
Figure 3B:
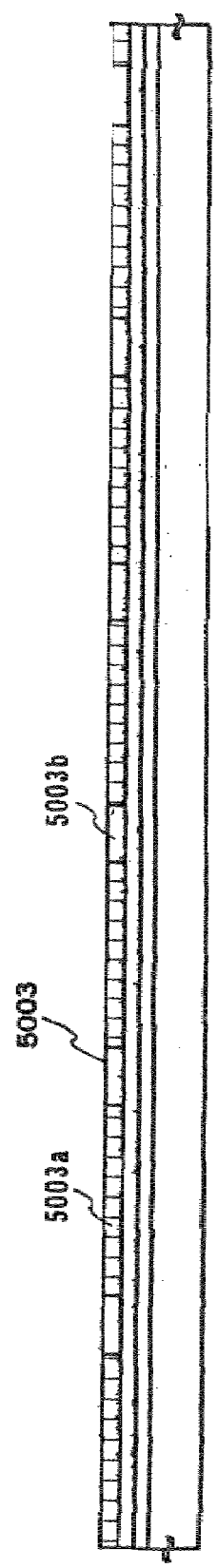

Then, the crystalline silicon film 5002 is irradiated with a first laser beam to form a crystalline silicon film 5003 (5003a, 5003b). In the present embodiment, an excimer laser beam of a pulsed laser beam having a frequency of 30 Hz, a beam width of 476 μm, and a energy density (a set value) of 529 mJ/cm$^2$ is used as the first laser beam. A stage on which the substrate 1500 comprising the crystalline silicon film 5002 is mounted is moved at the movement speed of 20 mm/sec, and the crystalline silicon film 5002 is irradiated with the first laser beam. Thus, the crystalline silicon film 5002 is irradiated with the first laser beam at the overlap ratio of 71.4%. Accordingly, the crystalline silicon film 5003 in which a region 5003a irradiated with the first laser beam and a region 5003b not irradiated with the first laser beam are alternately and repeatedly formed at the ratio of around 71:29 can be formed. Note that the first laser beam irradiation is performed in an atmosphere including 20% oxygen and 80% nitrogen. (FIG. 3B)

Figure 3C:
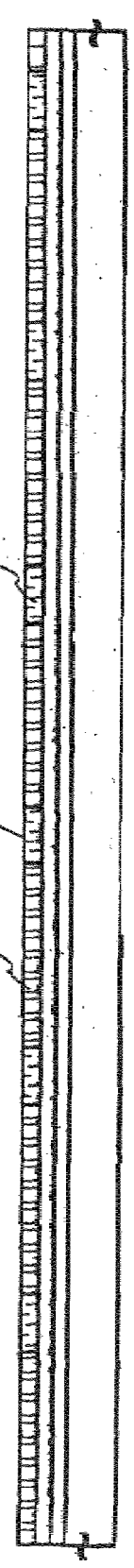

Subsequently, the crystalline silicon film 5003 is irradiated with a second laser beam to form a crystalline silicon film 5004 (5004a, 5004b). In the present embodiment, the same laser apparatus as the one used when irradiating with the first laser beam is utilized. As in the case with the first laser beam, an excimer laser beam of a pulsed laser beam having a frequency of 30 Hz, a beam width of 476 μm, and an energy density (a set value) of 529 mJ/cm$^2$ is used as the second laser beam. A stage on which the substrate 1500 comprising the crystalline silicon film 5003 is mounted is moved at the movement speed of 1 mm/sec, and the crystalline silicon film 5003 is irradiated with the second laser beam. Thus, the crystalline silicon film 5003 can be irradiated with the second laser beam at the overlap ratio of 14.3%. Accordingly, the crystalline silicon film 5003 is irradiated approximately 14 times at a given point. Note that the second a laser beam irradiation is performed in an atmosphere including 20% oxygen and 80% nitrogen. (FIG. 3C)

Therefore, a region 5004a irradiated with the first and the second laser beams and a region 5004b irradiated with only the second laser beam are periodically and repeatedly formed in a crystalline silicon film 5004. As described above, a formation method of the crystalline silicon film in the region 5004a differs form that of the crystalline silicon film in the region 5004b. As a result, film quality of each crystalline silicon film becomes different. Note that crystalline dispersion of a minor degree compared with the film quality difference between the regions 5004a and 5004b occurs in each regions 5004a and 5004b.

Figure 12:
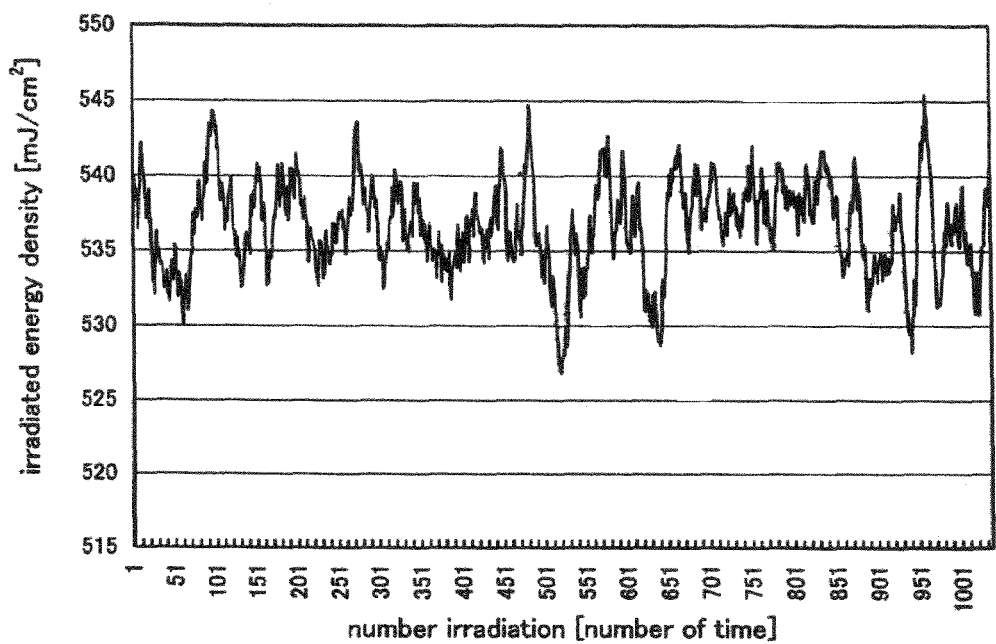
FIG. 12 is a graph showing relation between irradiation frequency of laser beams and dispersion of irradiation energy density.

In the present embodiment, the first and the second laser beams are linear shaped beams formed by using an optical system respectively. And the length in the minor axis direction of the beam is to be a beam width. Further, the first and the second laser beams come out from the same laser apparatus, and the irradiation conditions of the oscillatory frequency, the beam width, the energy density (a set value) and the like are same. FIG. 12 shows dispersion of energy density depending on the irradiation frequency of laser beams irradiated in the same irradiation condition as the first or the second laser beam. According to this, it can be seen that the energy density has extremely random dispersion to the irradiation frequency.

Figure 10A:
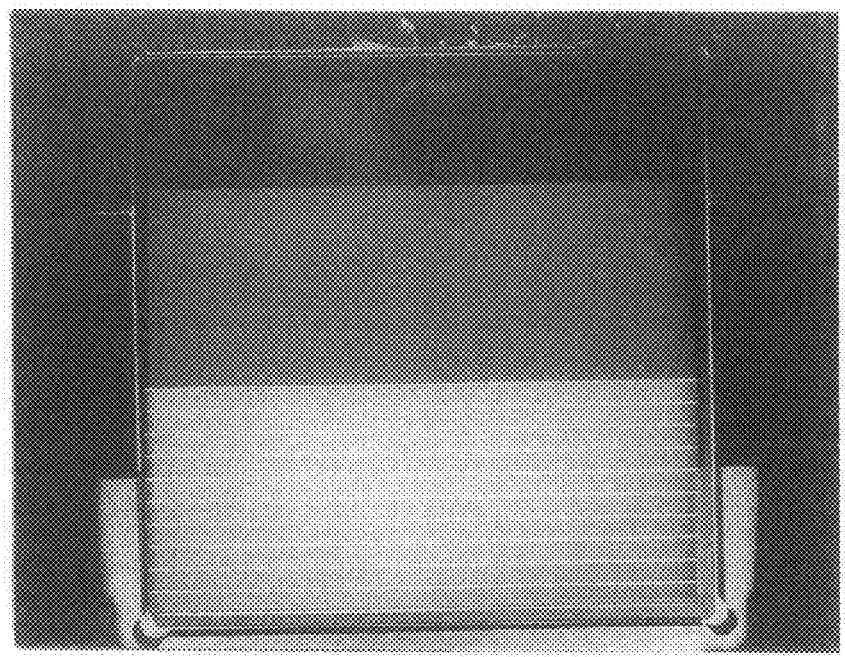
FIGS. 10A and 10B are a photograph and a pattern diagram for comparing the difference of the surface conditions of the semiconductor films, each of which is irradiated by different laser irradiation methods.
Figure 10B:
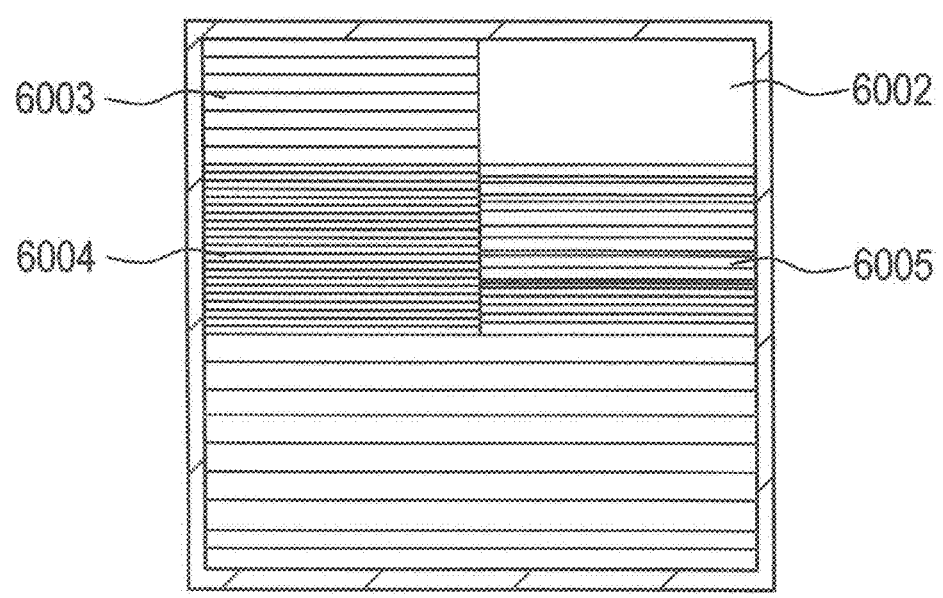

FIG. 10A is a photograph of a sample substrate in which crystalline silicon films 6002, 6003, and 6004 which are equivalent to the respective crystalline silicon films 5002, 5003, and 5004, respectively are formed by the same formation method as the one in 5002, 5003, and 5004. After nickel (Ni) is doped therein as a catalyst metal element, a crystalline silicon film formed by performing heat treatment is to be locally irradiated with the first and the second laser beams. Thus, the crystalline silicon film 6002 not irradiated with a laser beam at all, the crystalline silicon film 6003 irradiated with only the first laser beam, and the crystalline silicon film 6004 irradiated with both of the first and the second laser beams are formed in the same substrate. Moreover, a crystalline silicon film 6005 irradiated with only the second laser beam is also formed.

The sample substrate is taken a photograph by irradiating the sample substrate with halogen light diagonally in a dark room. Therefore, the catoptric light on the surface of the substrate appears as an image. It becomes lighter in the place having larger unevenness on the surface of the substrate on which the catoptric light is easily scattered, and darker in the place having smaller unevenness on the surface of the substrate on which the catoptric light is hardly scattered.

Since unevenness is formed on the surface of the crystalline silicon film irradiated with the laser beams (the first and the second laser beams), the difference in the unevenness causes the difference in the amount of the scattered light of the halogen light, thereby appearing as light and shade in the image. Accordingly, the crystalline silicon film 6002 is to be a dark image since it is not irradiated with the laser beam and has a flat surface. Further, the crystalline silicon film 6003 is to be a light image having a periodical striped pattern since a region of the crystalline silicon film 6003 which is irradiated with first laser beam has unevenness. The whole surface of the crystalline silicon film 6004 has unevenness since the whole surface of the film is irradiated with the second laser beam. Therefore, the whole surface of the crystalline silicon film 6004 has is lighter than that of the crystalline silicon films 6002 and 6003. Further, the region irradiated with the first and the second laser beams differs from the region irradiated with only the second laser beam in the unevenness of the film surface. And therefore, the difference of the unevenness appears as a periodical stripe pattern. The crystalline silicon film 6005 is irradiated with only the second laser beam, and the condition of the unevenness in the surface of the film varies under the influence of the output dispersion of the second laser beam, and a random striped pattern appears on the surface of the film.

As described above, the difference in the condition of the unevenness appears according to the difference of the laser irradiation manner. In the crystalline silicon film 5004, the region 5004a differs from the region 5004b in the unevenness of the film surface according to the presence or absence of the first laser beam irradiation.

In addition to an excimer laser as in the present embodiment, a pulsed oscillation type laser using YAG or YVO$_4$ may be used as a laser medium for the first and the second laser beams. In addition, the oscillatory frequency, the beam width, and the energy density of a laser beam are not limited to the above mentioned value, and they can be properly adjusted in view of the overlap ratio of each laser beam, the film quality of the formed crystalline silicon film and the like. It is not objectionable that the first laser beam differs form the second laser beam in the condition of the energy density, or the like.

It is possible to form a crystalline silicon film in which a region crystallized with a laser beam and a region not crystallized with a laser beam are periodically and repeatedly formed as the crystalline silicon film 5003 by using a continuous oscillation laser beam.

An amorphous semiconductor film such as amorphous silicon germanium ($Si_xGe_{1-x}$ (X=0.0001 to 0.02) can be used in order to form the crystalline silicon film 5004 in addition to the amorphous silicon film. Further, the process in which the crystalline silicon film 5002 is formed by using a catalyst metal element is not indispensable, and the crystalline silicon film may be formed by using the similar process to the process for forming the crystalline silicon films 5003 and 5004 after forming the crystalline silicon film. However, the formation of the crystalline silicon film 5002 as in the present embodiment has effect of improving the orientation of the crystalline silicon film. With respect to the film thickness, it is not limited to the one above-mentioned value, and it can be properly changed. Furthermore, after the formation of the crystalline silicon film 5004, the surface of the film may be flattened by irradiating the crystalline silicon film 5004 with a laser beam in the nitrogen atmosphere.

A thin oxide layer of 1 to 2 nm in thickness is formed on the surface of the crystalline silicon film 5004 by using ozone water. Then, an amorphous silicon film (not shown) having a thickness of 100 nm is formed thereon by sputtering. The catalyst metal element included in the crystalline silicon film 5004 is moved to the amorphous silicon film and removed (gettering) by heat treatment of furnace for 4 hours at 550° C. After the gettering, the amorphous silicon film which became useless (there is a case that the amorphous silicon film becomes crystalline silicon film by the effect of the catalyst metal element after gettering.) is removed by TMAH solution and further removed by hydrofluoric acid.

Semiconductor films 1502a to 1502d are formed in the region 5004a by separating from the crystalline silicon film 5004 after gettering. At the same time, a semiconductor film separated from the crystalline silicon film 5004 is formed in the region 5004b. In the present embodiment, an element having a same structure is formed in the regions 5004a and 5004b by the same process. Therefore, the element formed by using the semiconductor film of the region 5004b is not specially illustrated, and the description in the specification is also omitted.

An impurity doping (channel dope) may be performed in order to control the threshold value of the TFT before or after forming the semiconductor films 1502a to 1502d. As the impurity for doping, boron, phosphorus or the like is used.

Next, a gate insulating film 1503 is formed so as to cover the semiconductor films 1502a to 1502d. In the present embodiment, a silicon oxide film is formed to have a thickness of 110 nm by a plasma CVD method. Note that other insulating films may be used in addition to the silicon oxide film. The film thickness is not limited to the above-mentioned value and can be changed properly in consideration of the dielectric constant, and the like.

A conductive film 1504 and a conductive film 1505 are laminated on the gate insulating film 1503. In the present embodiment, the conductive film 1504 are formed to have a thickness of 30 nm by depositing tantalum nitride (TaN) with sputtering and the conductive film 1505 are formed to have a thickness of 370 nm by depositing tungsten (W) with sputtering. A material used for forming the conductive films 1504 and 1505 are not limited to tantalum nitride or tungsten as described above. And an element selected from the group consisting of Ta, W, Ti, Mo, Al, Cu, Cr and Nd, an alloy film or a compound material in which the above elements are combined, or a semiconductor film represented by a polycrystalline silicon film to which an impurity element such as phosphorus is added may be used for the conductive films. A material having higher adhesion to the gate insulating film is selected to the conductive film 1504 and a material having lower resistance in which ohmic value of approximately 9 to 20 $\mu\Omega$ is obtained is selected to the conductive film 1505. (FIG. 4A)

Then, the conductive films 1504 and 1505 are formed into the desired shape by patterning and etching. First, resist masks having sloping side walls 1510 to 1513 are formed. Then, the conductive film 1505 is etched by using the resist masks 1510 to 1513 as a mask, and the conductive film 1504 is formed by etching. The conductive film 1505 is manufactured into conductive films 1506b, 1507a, 1508a, and 1509a each of which has a taper angle of approximately 26° in its side wall. Moreover, the conductive film 1504 is also manufactured into the conductive films 1506a, 1507a, 1508a, and 1509a each of which has a taper angle of 15° to 45° in its side wall. (FIG. 4B)

The conductive films 1506b, 1507b, 1508b, and 1509b are selectively etched by using resist masks 1518 to 1521 as a mask. The conductive films 1506b, 1507b, 1508b, and 1509b are manufactured into the conductive films 1514b, 1515b, 1516b, and 1517b each of which has almost perpendicular side wall respectively. In this case, anisotropic etching which is anchored by perpendicular direction has to be used for etching. Also, the resist masks 1510 to 1513 which are used for etching in the above conductive films 1504 and 1505 are directly used for the resist masks 1518 to 1521. The conductive films 1506a, 1507a, 1508a, and 1509a are not processed and left as the conductive films 1514a, 1515a, 1516a and 1517a.

As described above, a gate electrode 1514 formed of the conductive films 1514a and 1514b, a gate electrode 1515 formed of the conductive films 1515a and 1515b, a gate electrode 1516 formed of the conductive films 1516a and 1516b, and the gate electrode 1517 formed of the conductive films 1517a and 1517b are formed.

Next, low concentration n-type impurities are doped using the gate electrodes 1514 to 1517 as a mask. In the present embodiment mode, phosphorus at the concentration $1\times10^{17}$ atmos/cm$^3$ is doped into the semiconductor films 1502a to 1502d as low concentration impurities to form low concentration impurity regions 1522a to 1522d. The low concentration impurities doping is performed in order to form an LDD (Light. Doped Drain) region for controlling off leak current of a TFT. The off leak current is changed by the doped impurities concentration. Therefore, the amount of the doping impurities is properly changed so that the value of the off leak current does not exceed the regulation. In the present embodiment, phosphorus is used as an n-type impurity, however it is not limited and the other impurities may be used. (FIG. 5A).

The high concentration n-type impurities are doped using resist masks 1525 to 1527 and the conductive films 1514b as a mask. The resist mask 1525 are formed in order to cover the semiconductor film 1502b and the gate electrode 1515, the resist mask 1526 are formed in order to cover the one part of the semiconductor film 1502c (the region which is to be an LDD region) and the gate electrode 1516, and the resist mask 1527 are formed in order to cover the semiconductor film 1502d and the gate electrode 1517. In the present embodiment, high concentration phosphorus of the $1\times10^{20}$ atmos/cm$^3$ is doped into the region in the semiconductor film 1502a over which the conductive film 1514a is not formed, and the region in the semiconductor film 1502c over which the resist mask 1526 is not formed. At the same time, low concentration phosphorus of $1\times10^{18}$ atmos/cm$^3$ is doped into the region in the semiconductor film 1502a over which the conductive film 1514a is formed, thereby forming a source (or a drain) 1523a, 1523b including high concentration phosphorus, and a low concentration impurity region 1524a, 1524b including low concentration phosphorus. The difference of the blocking capacity toward impurities being doped, between the region in which the conductive film 1514a is formed and the region in which the conductive film is not formed, is utilized. In the present embodiment, phosphorus is used as an n-type impurity, however it is not limited and other impurities may be used. (FIG. 5B)

Then, high concentration p-type impurities are doped using the resist masks 1530 and 1531 and the conductive films 1515b and 1517b as a mask. The resist mask 1530 is formed so as to cover the semiconductor film 1502a and the gate electrode 1514, and the resist mask 1531 is formed so as to cover the semiconductor film 1502c and the gate electrode 1516. In the present embodiment, high concentration boron of the $1\times10^{20}$ atmos/cm$^3$ is doped into the region of the semiconductor films 1502b and 1502d over which the conductive films 1515a and 1517a are not formed in order to form sources (or drains) 1528a and 1528b. At the same time, low concentration boron of $1\times10^{19}$ atmos/cm$^3$ is doped into the region of the semiconductor films 1502b and 1502d over which the conductive films 1515a and 1517a are formed, thereby forming the low concentration regions 1529a and 1529b. In the present embodiment, boron is used as a p-type impurity, however it is not limited and other impurities may be used. (FIG. 5C)

As described above, TFTs 1550 to 1553 are manufactured by the crystalline silicon film 5004 in the region 5004a. The TFTs 1550 and 1551 are the one for driver circuit, and the TFTs 1552 and 1553 are the one for driving a light-emitting element. As already mentioned, TFTs having same shapes as the TFTs 1550 to 1553 which are formed by using the region 5004b in the crystalline silicon film 5004 are manufactured. Note that a structure of a TFT and a method for manufacturing a TFT after forming the semiconductor films 1502a to 1502d are not limited to those illustrated in the present embodiment, and the others known structures or a methods may be used.

An interlayer insulating film 1532 is formed so as to cover a TFT manufactured over the substrate 1500. In the present embodiment, the interlayer insulating film is formed by silicon nitride oxygen (SiNO) of 100 nm in thickness having hydrogen by a plasma CVD method. Note that it is not limited to the silicon nitride oxygen (SiNO), and other insulating films may be used. The film thickness is not also limited to the above-mentioned value, and can be properly changed in consideration of the dielectric capacity.

In the next place, hydrogenation for terminating dangling bonds in a semiconductor layer is performed. In the present embodiment, hydrogenation is conducted by performing a heat treatment at 410° C. for 1 hour in the nitrogen atmosphere. The hydrogen is released from an interlayer insulating film 1532. In addition the above-mentioned method, the hydrogenation may be conducted by performing heat treatment in the atmosphere including hydrogen, or by using hydrogen plasma.

An interlayer insulating film 1533 is formed over the interlayer insulating film 1532. In the present embodiment, the interlayer insulating film 1533 is formed by applying acrylic resin of 0.8 μm in thickness. The acrylic resin is flat by itself, so the surface of the interlayer insulating film 1533 is to be flat.

Further, an interlayer insulating film 1534 is formed over the interlayer insulating film 1533. In the present embodiment, the interlayer insulating film 1534 is formed by depositing the silicon nitride film of 100 nm by using sputtering. Note that the interlayer insulating film 1534 has an effect of preventing impurities. (FIG. 6A)

Then, contact holes which reach to sources (or drains) 1523a, 1523b, 1528a, and 1528b are formed by performing-patterning and etching. In the present embodiment, the contact holes are formed by dry-etching the interlayer insulating films 1532, 1533, and 1534 after pattering.

A wiring 1535 for transmitting an electric signal to each TFT is formed. The wiring 1535 is formed as below: forming the conductive film in which titanium of 100 nm in thickness, aluminum of 350 nm in thickness including a few percentage of silicon, and titanium of 100 nm in thickness are laminated after forming contact holes, and performing patterning and etching thereon. Note that a material having electro conductivity other than the one described here may be used for forming the wiring. Furthermore, the lamination structure and the film thickness may be properly changed. (FIG. 6B)

An electrode 1536 of a light-emitting element having a contact area with the wiring 1535 is formed. The electrode 1536 of a light emitting element is formed as below: forming an amorphous ITO (indium Tin Oxide) film of 110 nm in thickness; performing patterning and etching thereover; and baking it at 220° C. for 60 min. The etching of the ITO is performed using water solution including oxalic acid $((COOH)_2)$ in the concentration of at least 5.0% at the water temperature of 45° C. so that the wiring 1535 is not corroded. Note that the condition of the baking for crystallizing an amorphous ITO film is not limited to the one described above, and can be properly changed.

Figure 7A:
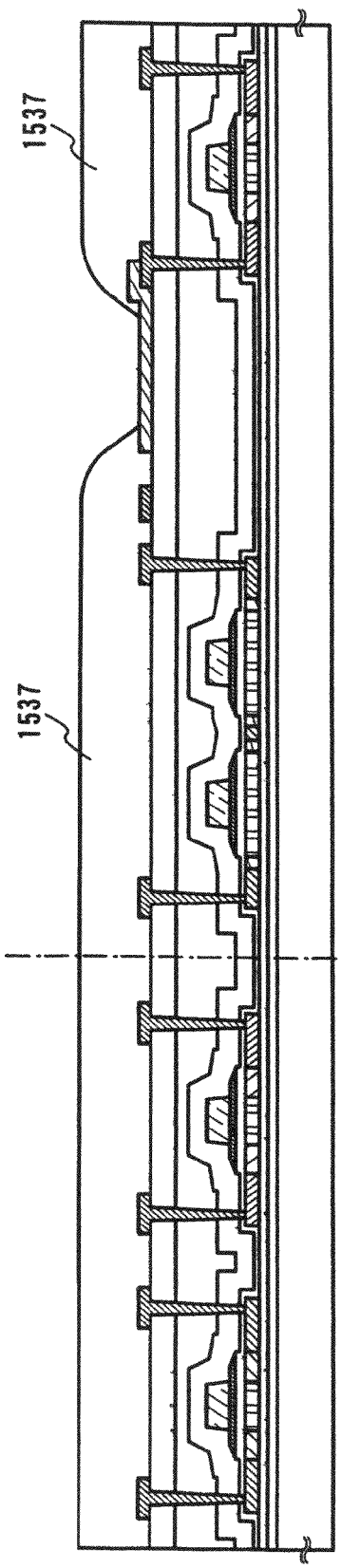
FIGS. 7A and 7B are diagrams showing a method for manufacturing a semiconductor device of the present invention, and a method for manufacturing a display device using the semiconductor device.
Figure 7B:
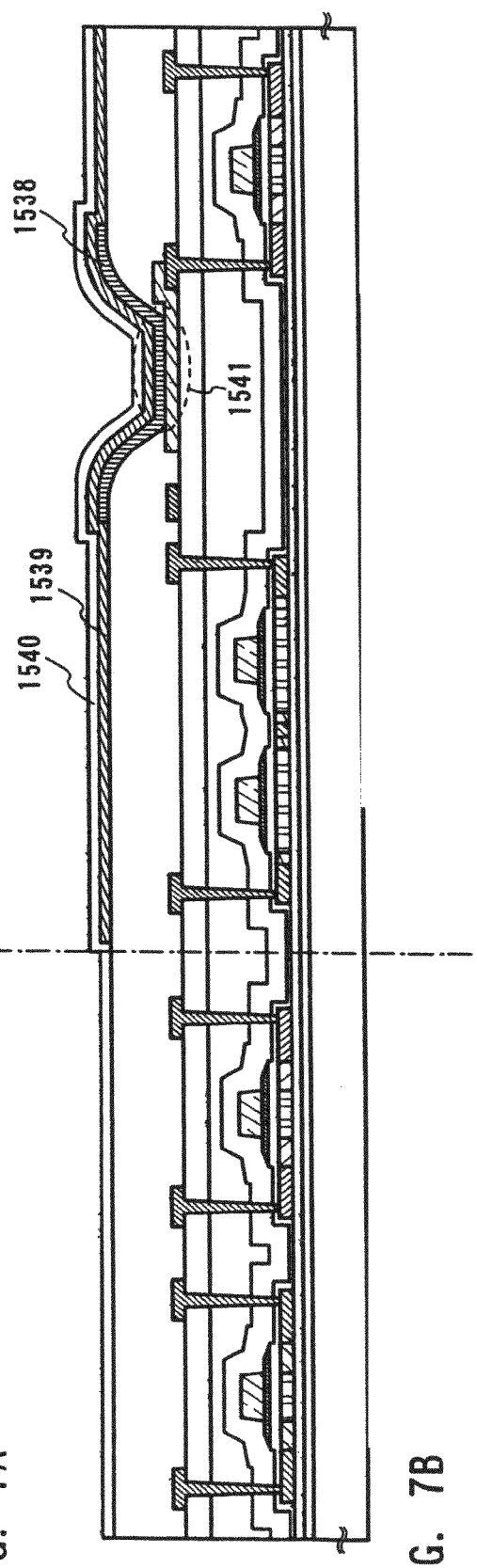

Next, an insulating film 1537 having an opening portion for exposing one part of the electrode 1536 of a light emitting element is formed. The insulating film 1537 is formed by applying photosensitivity positive type acrylic film of 1.5 μm in thickness, and exposing and developing thereof. The insulating film 1537, which is also referred to as an embankment, a bank, or the like, is provided for covering the wiring 1535 and the edge portion of the electrode 1536 of a light emitting element. Further, the insulating film 1537 functions as a partition wall layer for each light-emitting element. The insulating film 1537 has an edge portion having a round shape. In addition to photosensitivity positive type acrylic, a resin material having self flatness such as photosensitivity negative type acrylic, resist (both of positive type and negative type can be used) photosensitivity polyimide (both of positive type and negative type can be used), or an inorganic material can be used for forming the insulating film 1537. (FIG. 7A)

Figure 13:
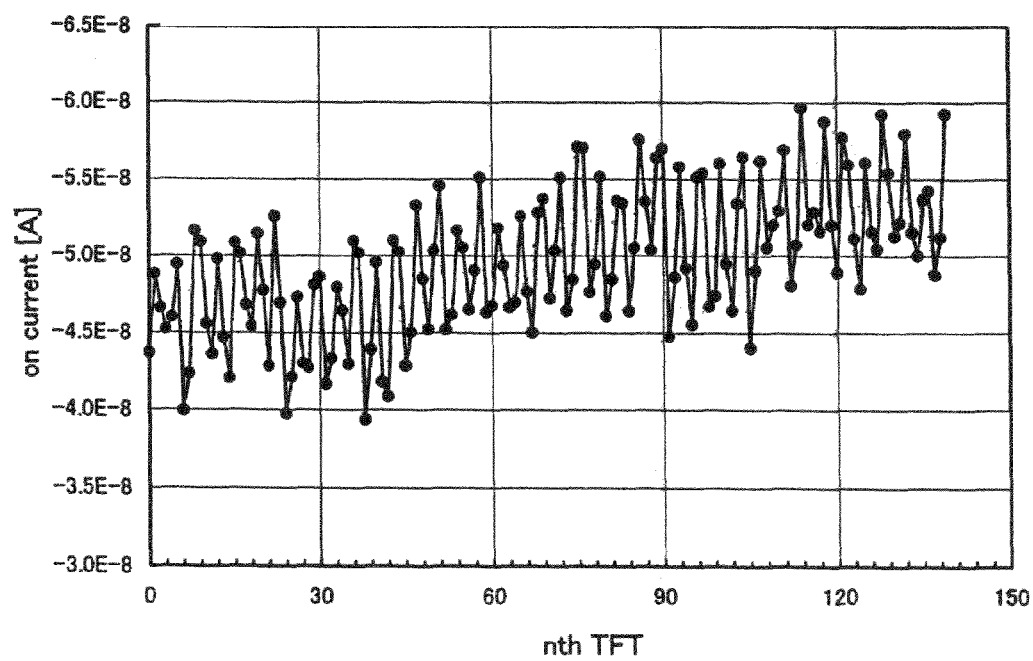
FIG. 13 is a graph showing on current of TFT dependence on the TFT's formation position.

FIG. 13 is a result showing on current characteristic of plural TFTs arranged in a line to the same direction as the minor axis direction of a laser beam, namely to the direction in which the crystalline silicon films 5004a and 5004b are periodically and repeatedly arranged in the TFT array substrate manufactured by the above described method. The measured TFTs are arranged at 189 μm intervals, and the design is to be a channel length of 420 μm, and a channel width of 6 μm. The channel is to be a p-type channel. The plural TFTs are respectively referred to as the nth TFT by the arranged order. In FIG. 13, the drain current, in the case that the gate voltage is 3V and the drain voltage is 5V, is to be on current value. The on current value belongs to a saturation region in VD-ID characteristic.

FIG. 13 shows that on current value of TFTs repeat higher on current value and lower on current value, and fluctuates while having the period by approximately three to four step (namely, approximately, 567 to 756 μm). The repetition period in the crystalline silicon film 5004 is approximately 666 μm (the value is obtained since the width of the crystalline silicon film 5004a corresponds to the beam width of the first laser beam). Thus, it would appear that the periodical change in the on current value of a TFT by the step shown in FIG. 13 signifies the periodical change of the film quality in the crystalline silicon film 5004.

As described above, a TFT array substrate over which plural TFTs are arranged, in which an electrical characteristic under the same electric signal of plural TFTs arranged in a line in at least one direction of columns or rows periodically fluctuates depending on the position in which each TFT is formed, can be manufactured.

In the present embodiment, a TFT for driver circuit and a TFT for driving a light-emitting element are manufactured in the same substrate. Therefore, when the on current value periodically fluctuates as described above, the amplitude of on current value causes dispersion of on current value to the TFT for driver circuit, and may disturb the operation. Consequently, the amplitude of the on current value is properly adjusted to the degree that does not affect the operation characteristic of TFT for driver circuit (in the range of operation margin of a TFT for driver circuit). Note that the dispersion of on current value includes dispersion of contiguous TFTs displaying the characteristic difference in the contiguous TFTs, and in-plane dispersion displaying dispersion of the entire TFTs in the substrate. However, the dispersion of contiguous TFTs is specially considered here. The dispersion of contiguous TFTs in the TFT array substrate manufactured in the present embodiment is approximately 10%. This value is reflected by the amplitude of the on current value which fluctuates periodically. The TFT for driver circuit is designed so as to drive without problems in the approximately ±10% dispersion. In addition, the present invention may not be applied to the place in which a TFT for driver circuit is formed, and the TFT may be formed by using other processes. It becomes possible by adjusting the irradiation position of a laser beam and the like.

A method for manufacturing an organic compound layer 1538 over the TFT array substrate manufactured as described above is described using FIG. 7B.

First, baking for removing moisture remained in the TFT array substrate and pretreatment such as irradiation of ultraviolet radiation are performed.

Next, CuPc with a thickness of 20 nm as a hole injection layer, α-NPD with a thickness of 40 nm as a hole transporting layer, Alq$_3$ including 0.3% of DMQD with a thickness of 37.5 nm as a light emitting layer, and Alq$_3$ with a thickness of 37.5 nm as a electron transporting layer are laminated, and represented as an organic compound layer 1538.

Note that the material for forming organic compound layer and the film thickness thereof are not limited to those described above, and the other known material may be used. Further, plural formation of organic compound layers having various lamination structures, materials and the like may be carried out for multicolor emission.

Then, an electrode 1539 of a light emitting element is formed. The electrode 1539 of a light emitting element is formed by lamination of calcium fluoride (CaF$_2$) and aluminum (Al—Li) including several percentage of Li.

As described above, a light emitting element 1541 in which the electrode 1536 of a light emitting element, the organic compound layer 1538, and the electrode 1539 of a light emitting element are laminated is formed.

Furthermore, a protection film 1540 for protecting a light emitting element 1541 is formed. In the present embodiment, a silicon nitride film is formed by sputtering for forming the conductive film 1540. Note that other materials such as DLC (Diamond like Carbon) may be used for forming the conductive film in addition to the silicon nitride film.

Furthermore, a sealant substrate and a Flexible Printed Circuit (FPC) are installed by a known method. In the present embodiment, a desiccating agent is installed in the sealant substrate.

As described above, a light-emitting device according to the present invention is manufactured.

In a light emitting apparatus of the present embodiment, light generated in the organic compound layer 1538 is let in from the side of the electrode 1536 of a light-emitting element. The light-emitting element 1541 may be formed for letting in light from the side of the electrode 1539 of a light-emitting element. In this case, a conductive film having light transmittance may be used for the electrode 1539 of a light-emitting element.

FIG. 8A is a top view of a light emitting device, and FIG. 8B is a sectional view taken on line A-A' of FIG. 8A. Reference number 2001 represents a source signal line driver circuit shown by a dotted line; 2002, a pixel portion; 2003, a gate signal line driver circuit; and 2004, a sealant substrate. The inside surrounded by the sealant substrate 2004 and the sealant 2005 is an empty space.

Reference number 2008 represents wiring for transmitting signals inputted to the source signal line driver circuit 2001 and the gate signal line driver circuit 2003. The wiring 2008 receives a video signal or a clock signal from a flexible print circuit (FPC) 2009 which will be an external input terminal. Only the FPC is illustrated here, but a print wiring board (PWB) may be attached to this FPC. The light emitting device referred to in the present specification is not only the body of the light emitting device but also the one attached a FPC or a PWB.

Figure 11A:
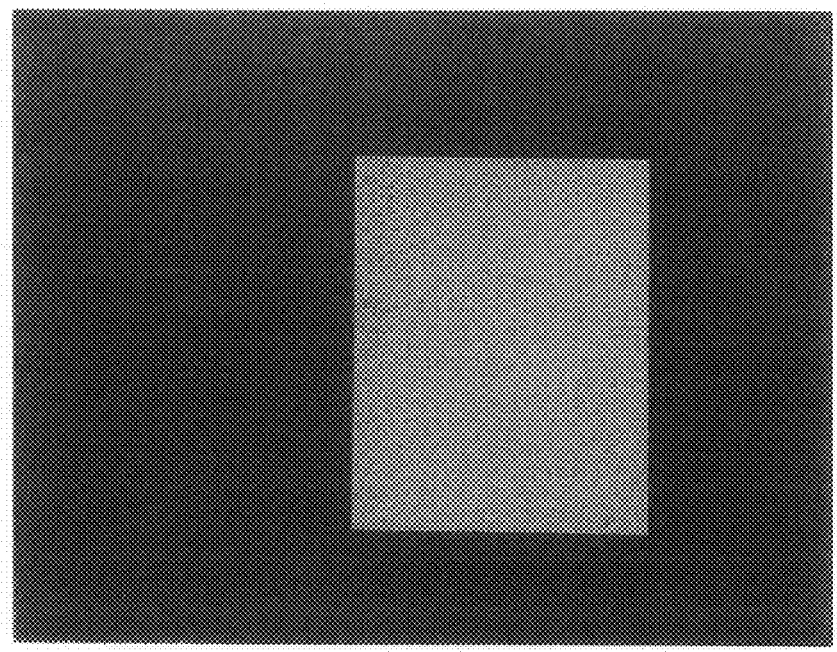
FIGS. 11A and 11B are photographs for comparing a display image in a display device of the present invention with a display image in display device manufactured by the conventional technique.
Figure 11B:
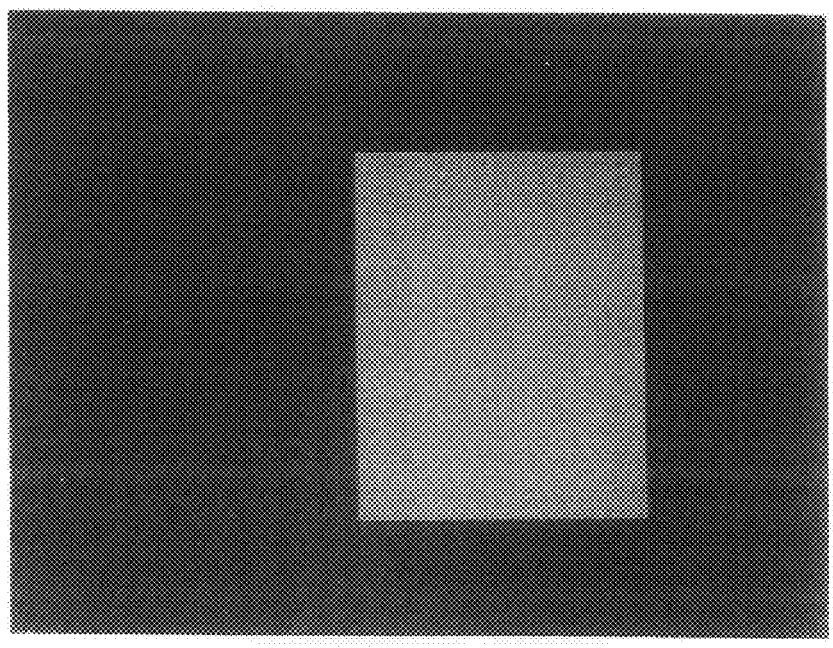

FIG. 11A is a photograph of display image in a light-emitting device manufactured according to the present invention. FIG. 11B is a photograph of display image in a light-emitting device manufactured by using a conventional technique. The display image is the one obtained by inputting the electric signal so that the display image is to be single brightness and a mono color, and displaying the signal. Here, the image is displayed in the dark room and is taken the photograph.

According to FIGS. 11A and 11B, it can be seen that striped shape display unevenness appears in the display image manufactured by a conventional technique; however, brightness unevenness is eliminated in the display image manufactured in the invention.

Usually, luminescence brightness is changed relative to the difference in on current value of a TFT for driving a light emitting element in a display device provided with a light emitting element. In the case of applying the same electric signal to all the TFTs for driving a light emitting element provided for the display device in order to displaying the whole image with single brightness and a mono color, it easily and visually recognized as display unevenness when the brightness of contiguous pixels is different at least 2%. Therefore, a display device capable of displaying 64 gradations requires having on current value of a TFT for driving a light-emitting element wherein the dispersion of contiguous space is at most a few percentages. However, brightness unevenness visually seems to be reduced in the display device of the present invention even the dispersion of contiguous space is approximately ±10%. This is because when the same electric signal is applied to all the TFTs for driving a light emitting element provided for the display device, the periodical stripe pattern appears and it is difficult to be visually recognized as the display unevenness in the display of the present invention.

The less different the brightness between a stripe and a stripe situated next to the stripe is, the less remarkable the striped shape is, therefore, the pattern can be visually recognized as a single image in the periodical striped pattern. Further, in the case that striped pattern having a stripe as thin as that can not be recognized, that can be visually recognized as an monocolored image. Consequently, the irradiation condition of a laser beam, the movement speed of the stage, and the like are required to be considered so that the visual advantage is produced by the electrical characteristic of plural TFTs arranged in a line to the minor axis direction of a laser beam that is formed to a linear shape.

Embodiment 2

Figure 9A:
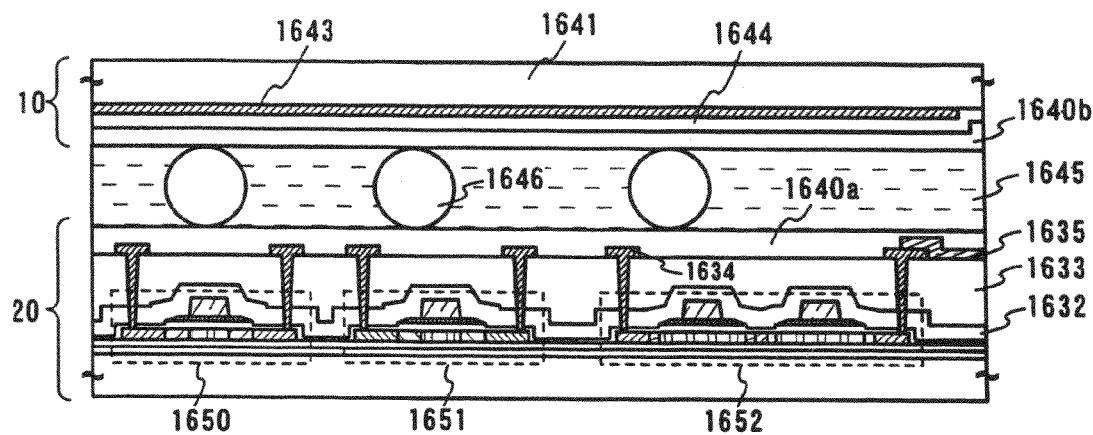
FIGS. 9A and 9B are display devices using a semiconductor device of the present invention.

In the present embodiment, a method for manufacturing a display device of the present invention is described with reference to FIGS. 9A and 9B.

According to the method for manufacturing a display device of the invention, a TFT array substrate in which the electrical characteristic under the same electric signals of plural TFTs arranged in the same direction as minor axis direction of a laser beam fluctuates periodically depending on the each TFT's location can be manufactured. In a display device manufactured of the TFT array substrate, random gradation unevenness resulted from liquid crystal unevenness (unevenness resulted from nonuniformity such as a cell gap) and irradiation energy of a laser beam can be visually reduced.

First, a method for manufacturing a TFT array substrate is described. In the present embodiment, a TFT array substrate provided with TFTs for a driver circuit of n-channel type or p-channel type, and pixel TFTs is manufactured.

The similar TFT for a driver circuit as the TFTs 1550 and 1551 which are illustrated in the present Embodiment 1 may be manufactured. The similar TFT as the TFT 1552 is used as a pixel TFT for a TFT driving a light-emitting element, and the similar TFT as the TFT 1553 is not manufactured in the embodiment. Therefore, the similar process as Embodiment 1 until the process for manufacturing TFTs may be used. The presence of the TFT 1553 may be adjusted by a photo mask. In addition, a structure of TFTs and a method for manufacturing TFTs after forming a semiconductor film is not limited, and other known structures and methods can be used as in the case with Embodiment 1.

In the present embodiment, a process after the TFTs manufacturing process is explained with reference to FIG. 9A.

After manufacturing TFTs for a driver circuit 1650 (n-channel type TFT), 1651 (p-channel type TFT), and a pixel TFT 1652, an interlayer insulating 1632 for covering the above mentioned TFTs is manufactured. In the present embodiment, the interlayer insulating 1632 is formed by depositing a silicon oxynitride (SiNO) including hydrogen of 100 nm thick by a plasma CVD method. The silicon oxynitride is not limited to be used, and other insulating films may be used. The film thickness is not limited to the above-mentioned value, either, and can be properly changed in view of dielectric constant.

Next, hydrogenation for terminating dangling bonds in a semiconductor layer is performed. In the present embodiment, hydrogenation is conducted by performing a heat treatment at 410° C. for 1 hour in the nitrogen atmosphere. The hydrogen is released from the interlayer insulating film 1632. The hydrogenation may be conducted by performing heat treatment in the atmosphere including hydrogen, or by using hydrogen plasma.

An interlayer insulating film 1633 is formed over the interlayer insulating film 1632. In the present embodiment, the interlayer insulating film 1633 is formed by applying acrylic resin of 1.6 µm in thickness. The acrylic resin has a flat surface thereon.

Next, a contact hole which penetrates the interlayer insulating films 1632 and 1633 is formed.

A wiring 1634 for transmitting electric signal to each TFT is formed. After forming contact holes, the conductive film in which titanium of 100 nm in thickness, aluminum including a few percentage of silicon of 350 nm in thickness, and titanium of 100 nm in thickness are laminated is formed, and then, patterning and etching is performed thereon, thereby, forming the wiring 1634. A material having electro conductivity other than the one described above may be used for forming the conductive film. Furthermore, the lamination structure and the film thickness may be properly changed.

A pixel electrode 1635 having a contact area with the wiring 1634 is formed. The pixel electrode 1635 is formed as below: forming an amorphous ITO (indium Tin Oxide) film of 110 nm in thickness by sputtering; performing patterning and etching thereon; and baking it at 220° C. for 60 min. The etching of the ITO is performed using water solution including oxalic acid $((COOH)_2)$ in the concentration of at least 5.0% at the water temperature of 45° C. so that the wiring 1634 is not corroded. The condition of the baking for crystallizing an amorphous ITO film is not limited to the one described above, and can be properly changed.

As stated above, a TFT array substrate 20 according to the present invention is manufactured.

Next, after forming an orientation film 1640a over the TFT array substrate, a rubbing treatment is performed on the orientation film.

Then, a counter substrate 10 in which a light-resistant film 1634, a pixel electrode 1644, and an orientation film 1640 are formed over the substrate 1641 is manufactured. Note that a color filter may be formed if necessary. A rubbing treatment is performed on the orientation film 1640b.

After the counter substrate 10 and the TFT array substrate 20 are laminated together, an unnecessary part is cut off. Further, a liquid crystal material 1645 is injected between the counter substrate 10 and the TFT array substrate 20, therefore, the two substrates are sealed together. Note that, the TFT array substrate 20 and the counter substrate 10 are sealed with a spacer 1646 interposed: therebetween. Furthermore, a FPC, a polarizing plate, and a phase plate are installed. A known method may be adapted to the above-described process. As described above, a liquid crystal device according to the present invention is manufactured.

Figure 9B:
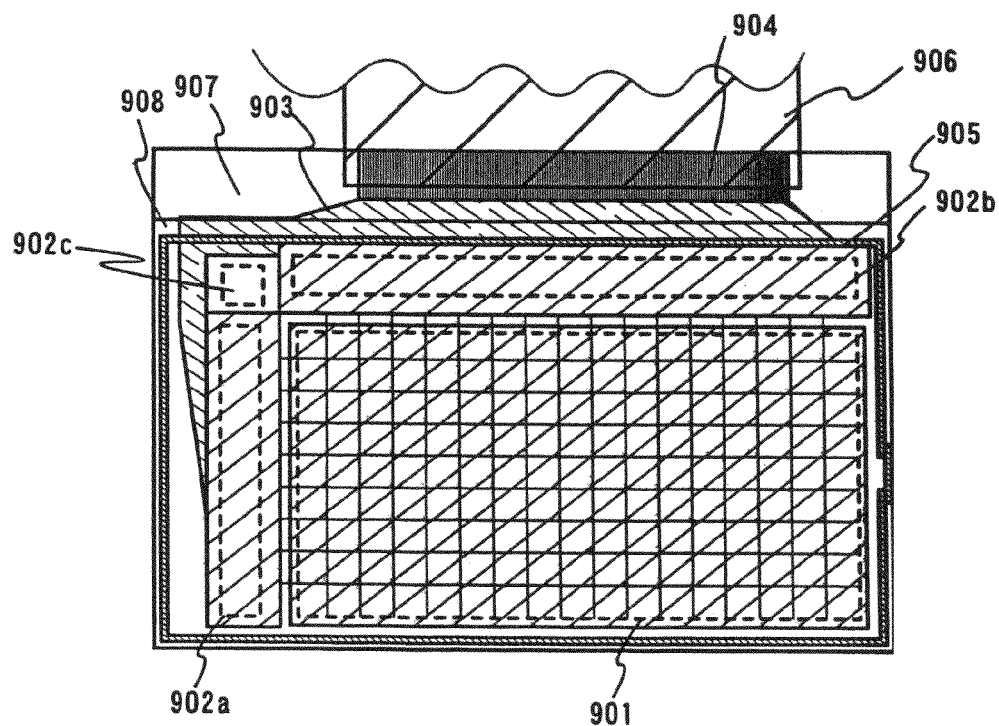

FIG. 9B is a top view of the liquid crystal display device manufactured according to the present invention. A scanning signal driver circuit 902a and an image signal driver circuit 902b are provided for the periphery of a pixel portion 901. The driver circuit is connected with an exterior input-output terminal 904 with a connection wiring band 903. In the pixel portion 901, a gate wiring band extended from the scanning signal driver circuit 902a and a data wiring band extended from the image signal driver circuit 902a cross at matrix shape, thereby forming a pixel. A sealant 905 is formed outside of the pixel portion 901, the scanning signal driver circuit 902a, the image signal driver circuit 902b, and a logic operation circuit 902c over a TFT array substrate 908, and inside of the exterior input terminal 904. The liquid crystal display device has a FPC board 906 which is connected to the exterior input-output terminal 904, and the exterior input-output terminal 904 is connected to the driver circuit respectively with the connection wiring band 903. The exterior input-output terminal 904 is formed of the same conductive film as the data wiring band. A FPC 906 has organic resin films such as polyimide in which a copper wiring is formed, and is connected to the exterior input terminal 904 with an anisotropic conductive bonding member.

Embodiment 3

In the present embodiment, electronic apparatus according to the present invention is described. A method for manufacturing a semiconductor device according to the present invention does not require a particular technique and the like to an optical system of a laser beam, neither require the higher frequency of maintenance of a laser oscillator in specific. Therefore, the semiconductor device can be formed easily and can be formed at lower cost compared with the one manufactured by the conventional technique. As a result, a display device using a semiconductor device of the present invention can be manufactured at lower cost. Further, electronic apparatus over which the display device is mounted can be also manufactured at lower cost, and the better image can be obtained. In addition, the display device can be applied to a light emitting device and a liquid crystal display device.

Figure 14A:
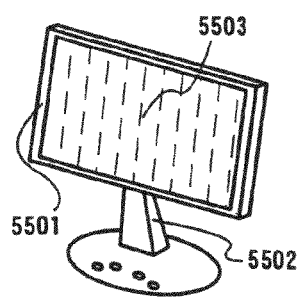
FIGS. 14A to 14F are diagrams showing an example of electronic apparatuses applying the present invention.

FIG. 14A is a display device, which includes a case 5501, a support medium 5502, and a display portion 5503. The present invention can be applied to the display device having the display portion 5503.

Figure 14B:
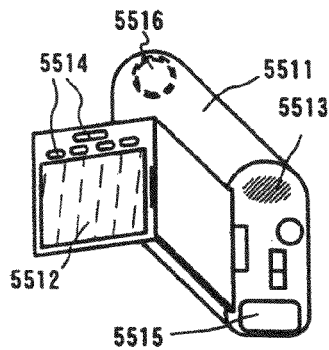

FIG. 14B is a video camera, which is composed of a body 5511, a display portion 5512, a sound input 5513, an operation switch 5514, a battery 5515, an image receiving portion 5516 and the like.

Figure 14C:
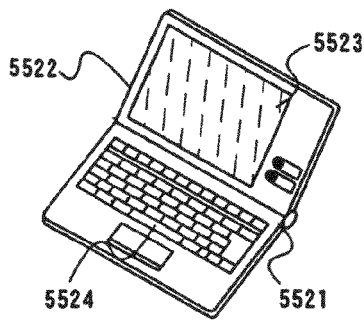

FIG. 14C is a laptop personal computer, which is composed of a body 5501, a case 5502, a display portion 5503, a keyboard 5504, and the like.

Figure 14D:
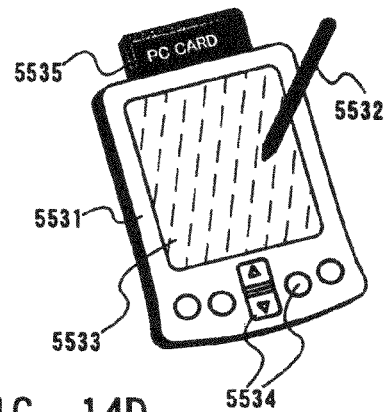

FIG. 14D is a personal digital assistant (PDA) manufactured by applying the present invention, which has a body 5531 provided with a display portion 5533, an external interface 5535, an operation button 5534, and the like. And a stylus 5532 as an accessory for an operation is also provided.

Figure 14E:
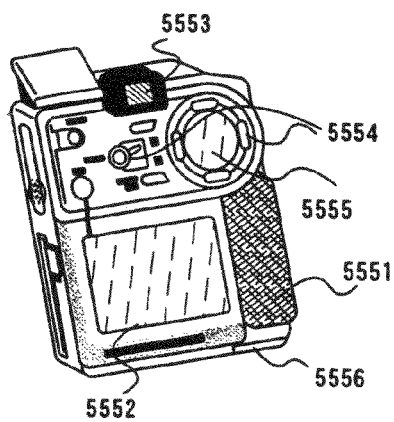

FIG. 14E is a digital camera, which is composed of a body 5551, a display portion (A) 5552, and an eye piece 5553, an operation switch 5554, a display portion (B) 5555, a battery 5556 and the like.

Figure 14F:
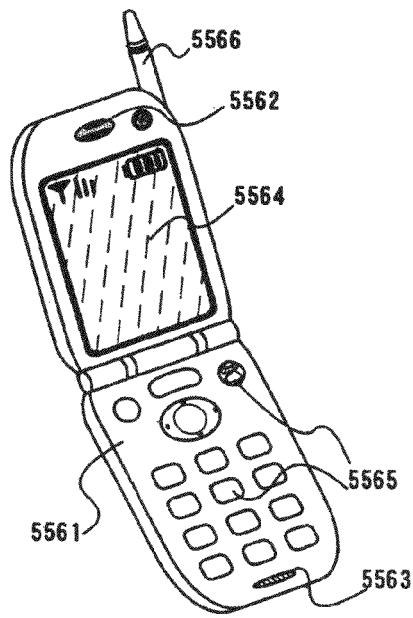

FIG. 14F is a cellular phone manufactured by applying the present invention. The cellular phone includes a body 5561 for which a display portion 5564, a sound output portion 5562, a sound input portion 5563, an operation switch 5565, an antenna 5566, and the like are provided.

According to a method for manufacturing a display device of the present invention, a display device provided with a TFT array substrate over which plural TFTs are arranged, in which the electrical characteristic under the same electric signals of plural TFTs arranged in a line in at least one direction of column or row fluctuates periodically depending on the place in which each TFT is formed can be manufactured. A periodical pattern is generated in a display image of a display device. Consequently, random brightness unevenness, gradation unevenness can be visually reduced specially in the case of displaying a whole image with single brightness and a mono color (namely, under the same electric signal) by utilizing a visual advantage that a periodical pattern is difficult to be visually recognized as display unevenness. A display device of the present invention can be manufactured easily and at lower cost compared with the one manufactured by the conventional technique since a particular technique and the like are not required to an optical system of laser apparatus, and a maintenance of a laser oscillator is not required frequently.

What is claimed is:

1. A display device comprising:
   a first region including a first thin film transistor;
   a second region including a second thin film transistor; and
   a third region including a third thin film transistor,
   wherein the first region, the second region and the third region are extended in a same direction,
   wherein the second region is sandwiched between the first region and the third region,
   wherein a crystallinity of a first semiconductor layer of the first thin film transistor is higher than that of a second semiconductor layer of the second thin film transistor, and
   wherein the crystallinity of the first semiconductor layer is substantially equal to that of a third semiconductor layer of the third thin film transistor.

2. The display device according to claim 1, wherein the display device is incorporated into an electronic device selected from the group consisting of a video camera, laptop personal computer, a personal digital assistant, a digital camera, and a cellular phone.

3. The display device according to claim 1, wherein an on current value of the first thin film transistor is higher than that of the second thin film transistor, and
   wherein an on current value of the third thin film transistor is higher than that of the second thin film transistor.

4. The display device according to claim 1,
   wherein a first interval is located between the first region and the second region,
   wherein a second interval is located between the second region and the third region,
   wherein the first interval and the second interval are formed to generate a periodical pattern.

5. The display device according to claim 1, wherein the first region, the second region, and the third region are formed periodically and repeatedly.

6. A display device comprising:
   a first region including a first thin film transistor;
   a second region including a second thin film transistor;
   a third region including a third thin film transistor; and
   a light emitting element over the first region, the light emitting element including a pair of electrodes and an organic compound layer,
   wherein the first region, the second region and the third region are extended in a same direction,
   wherein the second region is sandwiched between the first region and the third region,
   wherein a crystallinity of a first semiconductor layer of the first thin film transistor is higher than that of a second semiconductor layer of the second thin film transistor, and
   wherein the crystallinity of the first semiconductor layer is substantially equal to that of a third semiconductor layer of the third thin film transistor.

7. The display device according to claim 6, wherein the display device is incorporated into an electronic device selected from the group consisting of a video camera, laptop personal computer, a personal digital assistant, a digital camera, and a cellular phone.

8. The display device according to claim 6, wherein an on current value of the first thin film transistor is higher than that of the second thin film transistor, and
   wherein an on current value of the third thin film transistor is higher than that of the second thin film transistor.

9. The display device according to claim 6,
   wherein a first interval is located between the first region and the second region,
   wherein a second interval is located between the second region and the third region,
   wherein the first interval and the second interval are formed to generate a periodical pattern.

10. The display device according to claim 6, wherein the first region, the second region, and the third region are formed periodically and repeatedly.

11. The display device according to claim 6, wherein the organic compound layer comprises a hole transporting layer, a light emitting layer, and an electron transporting layer.

12. A display device comprising:
a TFT array substrate comprising:
a first region including a first thin film transistor;
a second region including a second thin film transistor; and
a third region including a third thin film transistor;
a liquid crystal material over the TFT array substrate; and
a counter substrate over the liquid crystal material,
wherein the first region, the second region and the third region are extended in a same direction,
wherein the second region is sandwiched between the first region and the third region,
wherein a crystallinity of a first semiconductor layer of the first thin film transistor is higher than that of a second semiconductor layer of the second thin film transistor, and
wherein the crystallinity of the first semiconductor layer is substantially equal to that of a third semiconductor layer of the third thin film transistor.

13. The display device according to claim 12, wherein the display device is incorporated into an electronic device selected from the group consisting of a video camera, laptop personal computer, a personal digital assistant, a digital camera, and a cellular phone.

14. The display device according to claim 12, wherein an on current value of the first thin film transistor is higher than that of the second thin film transistor, and
wherein an on current value of the third thin film transistor is higher than that of the second thin film transistor.

15. The display device according to claim 12,
wherein a first interval is located between the first region and the second region,
wherein a second interval is located between the second region and the third region,
wherein the first interval and the second interval are formed to generate a periodical pattern.

16. The display device according to claim 12, wherein the first region, the second region, and the third region are formed periodically and repeatedly.

17. The display device according to claim 12, wherein the liquid crystal material is sealed with the counter substrate and the TFT away substrate.

18. The display device according to claim 12, wherein the counter substrate comprises a light-resistant film, a pixel electrode, and an orientation film.

* * * * *